(12) United States Patent
Arnold et al.

(10) Patent No.: US 11,631,814 B2
(45) Date of Patent: Apr. 18, 2023

(54) TWO-DIMENSIONAL CARBON NANOTUBE LIQUID CRYSTAL FILMS FOR WAFER-SCALE ELECTRONICS

(71) Applicant: Wisconsin Alumni Research Foundation, Madison, WI (US)

(72) Inventors: Michael Scott Arnold, Middleton, WI (US); Katherine Rose Jinkins, Evanston, IL (US); Padma Gopalan, Madison, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 119 days.

(21) Appl. No.: 17/376,295

(22) Filed: Jul. 15, 2021

(65) Prior Publication Data

US 2023/0028346 A1    Jan. 26, 2023

(51) Int. Cl.
*H01L 51/00* (2006.01)
*H01L 51/05* (2006.01)

(52) U.S. Cl.
CPC ...... *H01L 51/0012* (2013.01); *H01L 51/0003* (2013.01); *H01L 51/0048* (2013.01); *H01L 51/0545* (2013.01); *H01L 51/0558* (2013.01)

(58) Field of Classification Search
CPC .................. H01L 51/0012; H01L 51/0048
See application file for complete search history.

(56) References Cited

U.S. PATENT DOCUMENTS

| | | |
|---|---|---|
| 6,741,017 B1 | 5/2004 | Ide et al. |
| 10,873,026 B2 | 12/2020 | Arnold et al. |
| 2005/0208304 A1 | 9/2005 | Collier et al. |
| 2008/0160290 A1 | 7/2008 | Park et al. |
| 2008/0224123 A1 | 9/2008 | Martin et al. |
| 2009/0035469 A1 | 2/2009 | Sue et al. |
| 2009/0246408 A1 | 10/2009 | Chan et al. |
| 2010/0004995 A1 | 3/2010 | Kwon |
| 2010/0101983 A1 | 4/2010 | Butler et al. |
| 2010/0183844 A1 | 7/2010 | Xiong et al. |

(Continued)

FOREIGN PATENT DOCUMENTS

| | | |
|---|---|---|
| WO | WO 2007/01571 A2 | 2/2007 |
| WO | WO2015/123251 | 8/2015 |

OTHER PUBLICATIONS

Jinkins et al., "Substrate-Wide Confined Shear Alignment of Carbon Nanotubes for Thin Film Transistors," *Adv. Electron. Mater.* 2019, 5, 1800593.

(Continued)

*Primary Examiner* — Anthony Ho
(74) *Attorney, Agent, or Firm* — Bell & Manning, LLC

(57) ABSTRACT

Methods of forming films of aligned carbon nanotubes on a substrate surface are provided. The films are deposited from carbon nanotubes that have been concentrated and confined at a two-dimensional liquid/liquid interface. The liquid/liquid interface is formed by a dispersion of organic material-coated carbon nanotubes that flows over the surface of an immiscible liquid within a flow channel. Within the interface, the carbon nanotubes self-organize via liquid crystal phenomena and globally align along the liquid flow direction. By translating the interface across the substrate, large-area, wafer-scale films of aligned carbon nanotubes can be deposited on the surface of the substrate in a continuous and scalable process.

18 Claims, 25 Drawing Sheets

(56) References Cited

U.S. PATENT DOCUMENTS

2010/0320140 A1 12/2010 Nowak et al.
2017/0047460 A1 2/2017 Naseem et al.

OTHER PUBLICATIONS

Li et al., "Langmuir-Blodgett Assembly of Densely Aligned Single-Walled Carbon Nanotubes from Bulk Materials," *J. Am. Chem.Soc.* 2007, 129, 4890-4891.

Sgobba et a., "Langmuir-Schaefer Films for Aligned Carbon Nanotubes Functionalized with a Conjugate Polymer and Photoelectrochemical Response Enhancement," *ACS Appl. Mater. Interfaces*, 2014, 6, 1, 153-158.

Matsui et al., "Simple Fabricatino of Carbon Nanotube Mololayer Film," Chemistry Letters vol. 35, No. 1, (2006) pp. 42-43.

Zhang et al., "Directing single-walled carbon nanotubes to self-assemble at water/oil interfaces and facilitate electron transfer," *Chem. Commun.*, 2008, 4273-4275.

Zhang et al., "Carbon Nanotubes as Liquid Crystals," *Small*, 2008, 4, No. 9, 1270-1283.

Ko et al., "Liquid-Crystalline Processing of Highly Oriented Carbon Nanotube Arrays for Thin-Film Transistors," *Nano Letters*, 2006, vol. 6, No. 7, 1443-1448.

Jinkins et al., "Nanotube Alignment Mechanism in Floating Evaporative Self-Assembly," *Langmuir* 2017, 33, 46, 13407-13414 Publication Date:Oct. 23, 2017 https://doi.org/10.1021/acs.langmuir. 7b02827 Copyright © 2017 American Chemical Society.

Wang et al., "Coating Carbon Nanotubes with Polymer in supercritical carbon dioxide," Chemical Communications, No. 15, Jan. 1, 2006, p. 16701672.

Mat et al., "Experimental observation on the flow-induced assembly of Carbon nanotube suspensions to form helical bands," *Rheol Acta* (2007) 46:979-987.

Pierard et al., "Production of short carbon nanotubes with open tips by ball milling," *Chemical Physics Letters* 335 (2001) 1-8.

Tardani et al., "Shear Orientation in Nematic Carbon Nanotube Dispersions: A Combined NMR Investigation," *J. Phys. Chem. C.* 2013, 117, 8556-8562.

Binder, Wolfgang H. "Supramolecular assembly of nanoparticles at liquid-liquid interfaces." *Angewandte Chemie International Edition* 44.33 (2005): 5172-5175.

Schwenke, Konrad, Lucio Isa, and Emanuela Del Gado. "Assembly of nanoparticles at liquid interfaces: crowding and ordering." Langmuir 30.11 (2014): 3069-3074.

Matsui et al., "Fabrication of densely packed multi-walled carbon nanotube ultrathin films using a liquid-liquid interface," *Journal of Materials Chemistry* 17 36 (2007) 3806-3811.

Feng, Tao, David A. Hoagland, and Thomas P. Russell. "Assembly of acid-functionalized single-walled carbon nanotubes at oil/water interfaces." Langmuir 30.4 (2014): 1072-1079.

Matsui, Jun, Kohei Yamamoto, and Tokuji Miyashita. "Assembly of untreated single-walled carbon nanotubes at a liquid-liquid interface." Carbon 47.6 (2009): 1444-1450.

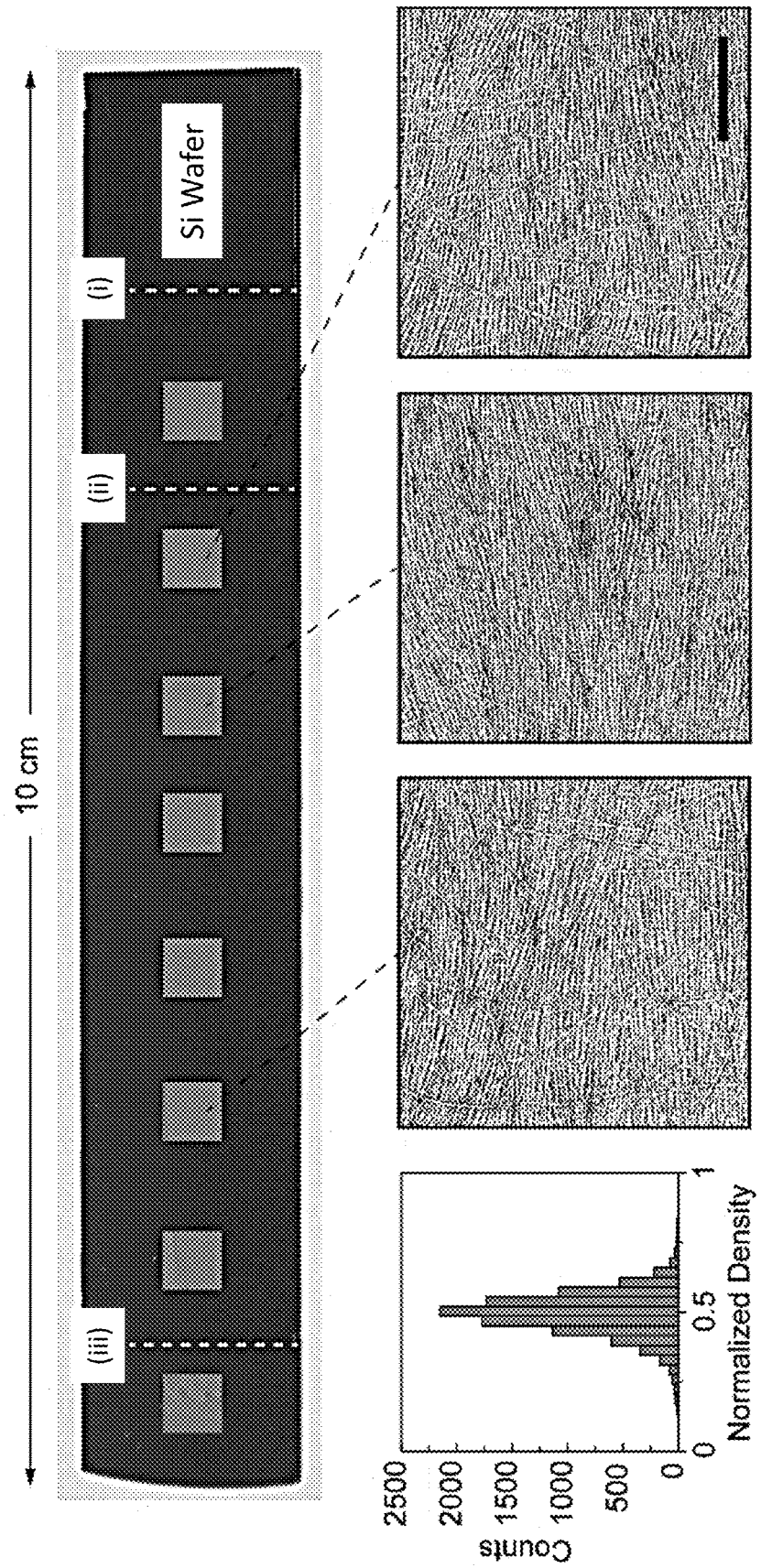

TWO-DIMENSIONAL CARBON NANOTUBE LIQUID CRYSTAL FILMS FOR WAFER-SCALE ELECTRONICS

REFERENCE TO GOVERNMENT RIGHTS

This invention was made with government support under 1727523 awarded by the National Science Foundation. The government has certain rights in the invention.

BACKGROUND

As field-effect transistors (FETs) continue to shrink and node scaling in conventional semiconductor devices becomes increasingly difficult, other next-generation materials must be investigated. Carbon nanotubes are one material candidate and are projected to outperform conventional semiconductors in FETs in terms of power efficiency, electrostatic gate control, and switching speed—but only when organized into aligned arrays.

The fabrication of aligned arrays of nanotubes from solution approaches has been investigated using shear, vacuum filtration, directed evaporation, dielectrophoresis, elastomeric release, dimension-limited self-alignment, DNA directed assembly, and Langmuir-Blodgett and -Schaefer methods among others. However, more research is needed before any of these methods will be able to meet the needs of the semiconductor electronics industry. In addition to alignment, especially important are achieving uniformity at the wafer-scale and realizing partial monolayer coverage at an intermediate nanotube packing density of roughly 100 $\mu m^{-1}$ (because higher nanotube densities may result in crosstalk effects that decrease performance while lower densities yield lower currents).

The self-assembly of nanoparticles in solution at liquid interfaces offers an attractive route to fabricate supramolecular and two-dimensional (2D) arrangements of nanostructures. This assembly is highly dynamic, enabling defects to be corrected quickly, as opposed to assembly and deposition directly on substrates. Nanoparticle adsorption at liquid/liquid interfaces occurs to minimize liquid/liquid interfacial energy, and the size of the nanoparticles, interfacial tension, and particle surface wettability all affect interface adsorption.

Previously, locally aligned rafts of multi-walled carbon nanotubes and relatively thick bundles or mats of randomly oriented single-walled nanotubes have been deposited from liquid/liquid interfaces. However, these assemblies have lacked long range order, and both multiwalled and disordered single-walled nanotube films are less desirable for electronics. Separately, the bulk liquid crystal assembly of nanotubes (i.e., not at a liquid/liquid interface) has been studied; however, bulk liquid crystals typically produce thick multilayer nanotube films with or without global alignment and rarely demonstrate sub-monolayer aligned nanotube arrays desired for FETs.

Prior studies have also reported that stripes of aligned nanotubes can be deposited onto substrates during the spreading of sequential droplets of chloroform-based nanotube inks on an aqueous subphase in a process called floating evaporative self-assembly (FESA). (Jinkins, K. R. et al. *Langmuir* 33, 13407-13414 (2017).) The excellent alignment, individualization, and packing of nanotubes in FESA films have enabled FETs with on-state current densities exceeding that of Si and GaAs devices and also high-speed radio-frequency devices. (Brady, G. J. et al. *Sci. Adv.* 2, (2016); Brady, G. J. et al. *J. Appl. Phys.* 122, 124506 (2017); and Cao, Y. et al. *ACS Nano* 10, 6782-6790 (2016).) However, the drop-by-drop nature of deposition can be difficult to scale.

SUMMARY

Methods for forming films of aligned carbon nanotubes are provided. The methods include forming a liquid dispersion comprising organic material-coated carbon nanotubes dispersed in a first liquid; and forming a channel that is defined by: a deposition wall; a confining wall that is separated from the deposition substrate by a gap; and a second liquid that is immiscible with the liquid dispersion spanning the gap between the deposition wall and the confining wall and providing a channel floor.

One example of a method includes the steps of: cooling the second liquid to a temperature of 15° C. or lower; flowing the liquid dispersion of organic material-coated carbon nanotubes through the channel, over the cooled second liquid, to form an interface between the liquid dispersion of organic material-coated carbon nanotubes and the cooled second liquid, wherein the organic material-coated carbon nanotubes become concentrated at the interface and aligned within the interface along the flow direction; and translating the deposition wall across the interface as the liquid dispersion of organic material-coated carbon nanotubes flows through the channel, whereby organic material-coated carbon nanotubes are deposited from the interface onto a surface of the deposition wall.

In another example of a method, the deposition wall and the floor of the channel define a tilt angle in the range from 5° to 85° and the method includes the additional steps of flowing the liquid dispersion of organic material-coated carbon nanotubes through the channel, over the second liquid, to form an interface between the liquid dispersion of organic material-coated carbon nanotubes and the second liquid, wherein the organic material-coated carbon nanotubes become concentrated at the interface and aligned within the interface along the flow direction; and translating the deposition wall across the interface as the liquid dispersion of organic-material coated carbon nanotubes flows through the channel, whereby organic material-coated carbon nanotubes are deposited from the interface onto the deposition wall.

Other principal features and advantages of the invention will become apparent to those skilled in the art upon review of the following drawings, the detailed description, and the appended claims.

BRIEF DESCRIPTION OF THE DRAWINGS

Illustrative embodiments of the invention will hereafter be described with reference to the accompanying drawings, wherein like numerals denote like elements.

FIGS. 2A-2H show the effect of flow on CNT alignment and demonstration of CNT alignment across a 10 cm wide $SiO_2$/ Si wafer piece. FIGS. 2A and 2B show SEM images of films obtained with a static CNT dispersion and with a flowing CNT dispersion. The inset in FIG. 2B is a histogram (manually extracted) of orientation angle, weighted by nanotube length. The x-axis varies from −90 to 90°. FIG. 2C is a SEM image of a CNT film made using FESA. The scalebar in FIG. 2C is 250 nm and applies to FIGS. 2A-2C. FIGS. 2D-2E show Raman spectroscopy maps of relative carbon nanotube density from each respective film in FIGS. 2A-2B. Scalebar at right of FIG. 2E is linear and applies to FIGS. 2D-2F. The scalebar in FIG. 2E is 250 μm and applies to FIGS. 2D-2E. Histograms of nanotube density from the Raman maps are included as insets in each panel. The x-axis of each histogram quantifies nanotube density, normalized so that the mode of each distribution occurs at density of 0.5 (arbitrary units). FIG. 2F shows Raman spectroscopy maps of the relative nanotube density overlaid on an optical image of the 10 cm wide $SiO_2$/Si wafer piece with a film of aligned CNTs deposited thereon. The non-aqueous CNT dispersion was injected at position (i), and the flow of the dispersion was fully developed between regions (ii) and (iii). FIG. 2G shows a histogram of the relative density from the maps between positions (ii) and (iii) on the deposition substrate. FIG. 2H shows SEM images of the aligned carbon nanotube film from approximate areas indicated across the sample. The scalebar in the right SEM image is 500 nm and applies to all SEM images in FIG. 2H.

FIGS. 3A-3C show SEM images of CNT films fabricated with volumetric flow rates of 0, 1, and, 4 mL $min^{-1}$, respectively, overlaid with local director orientations obtained from 2D fast Fourier transform analysis. The scalebars in FIGS. 3A-3C are 1 μm. FIGS. 3D-3F show director orientation distributions at flow rates of 0, 1, and, 4 mL $min^{-1}$. The dashed line in FIG. 3F is the Gaussian fit of the local orientation histogram from FIG. 2B. FIGS. 3G-3I show polarized optical microscopy (POM) images from CNT films fabricated with volumetric flow rates of 0, 1, and, 4 mL $min^{-1}$, respectively. Scalebar in FIG. 3I is 250 μm and applies to FIGS. 3G-3I. SEM image inset in FIG. 3H shows −½ (trio of darker curved lines in the lower portion of the inset) and +½ (pair of darker curved lines in the upper portion of the inset) liquid crystal defects in CNT films. Scalebar in inset is 2 μm.

FIGS. 4A-4C show SEM images of CNT films fabricated using CNT concentrations of 0.1, 5, and 100 μg $mL^{-1}$, respectively. The scalebar in FIG. 4C is 500 nm and applies to FIGS. 4A-4C. FIG. 4D shows packing density of resolvable rods as a function of bulk dispersion concentration. FIGS. 4E-4G show POM images from CNT films deposited at 35, 23, and 10° C., respectively. The scalebar in FIG. 4G is 200 μm and applies to FIGS. 4E-4G. To achieve temperatures of 35 and 10° C., the water subphase/trough was heated on a hot plate and placed in an ice bath, respectively. In FIG. 4G, faint horizontal lines were spaced with a regular period of 29.6 μm. The substrate motor lift-rate of 2670 μm $s^{-1}$ divided by the line period corresponds to a frequency of $9.0 \times 10^1$ Hz, matching a frequency of $9.0 \times 10^1$ Hz inherent to the substrate lift motor control; therefore, these faint lines are artifacts. Histograms of POM image pixel intensity are shown in the insets to FIGS. 4E-4G. FIG. 4H shows a SEM image from the sample in FIG. 4G. The scalebar in FIG. 4H is 500 nm.

FIG. 5A shows a schematic of a nanotube array aligned on a $SiO_2$/Si back gate with top Pd source and drain contacts. FIG. 5B shows $I_{DS}$ versus $V_{GS}$ curves for representative back gated FETs. The on/off ratio was typically greater than $10^2$ at $V_{DS}$ of −1 V. Inset: $I_{DS}$ versus $V_{DS}$ curves as $V_{GS}$ was varied from −8 to −2 V (top to bottom) in 2 V steps. FIG. 5C shows on-current of all FETs measured at $V_{DS}$ of −1 V. FIG. 5D shows a schematic of a nanotube array aligned on a $SiO_2$/Si substrate with top ion gel top gate and Pd source and drain contacts. FIG. 5E shows $I_{DS}$ versus $V_{GS}$ curves for CNT films (nanotube packing density of 25-28 $\mu m^{-1}$) with ion gel top gate. This device exhibited a subthreshold swing of 60 mV $decade^{-1}$. The on/off ratio of FETs ($L_{ch}$=130 nm) with an ion gel top gate was typically greater than $10^5$ at $V_{DS}$ of −0.1 V.

FIGS. 6D-6F show additional SEM images and FFT analysis.

DETAILED DESCRIPTION

Figures 1A, 1B:
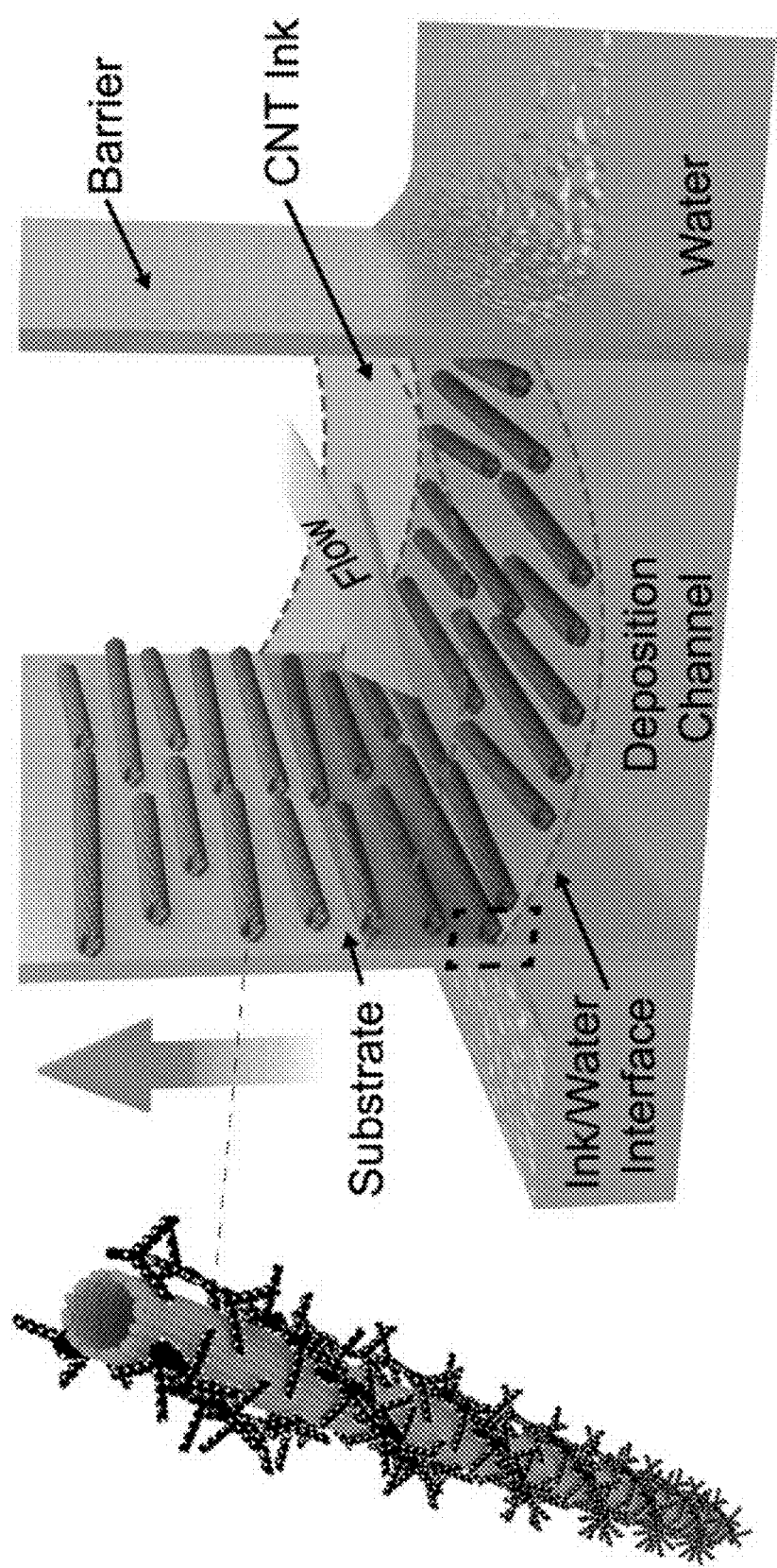
FIG. 1A shows a polymer wrapped arc-discharge CNT.
FIG. 1B shows an apparatus for the deposition of a film of aligned CNTs.
Figure 1D:
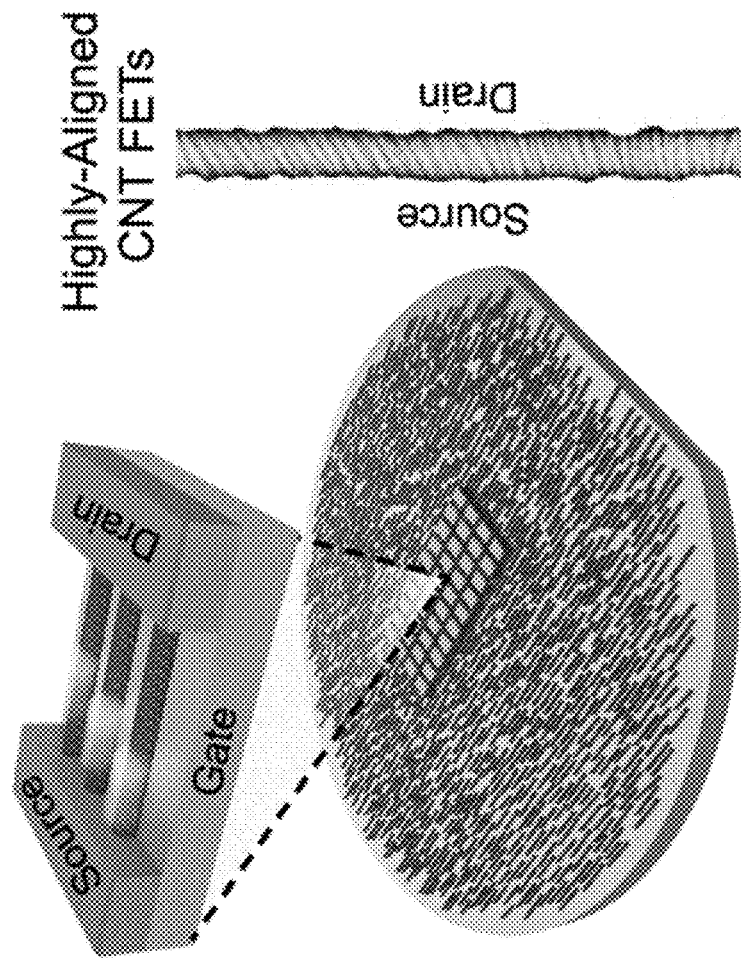
FIG. 1D, right, shows a scanning electron microscopy (SEM) image of aligned CNTs in FET channel of length 134 nm.

Methods of forming films of aligned carbon nanotubes on a substrate surface are provided. The films are deposited from a two-dimensional (2D) liquid/liquid interface in which carbon nanotubes that have been concentrated and confined. The liquid/liquid interface is formed by a liquid dispersion of organic material-coated carbon nanotubes that flows tangentially over the surface of an immiscible liquid within a flow channel. Within the interface, the carbon nanotubes self-organize via liquid crystal phenomena and globally align along the liquid flow direction. By translating the interface across a substrate, large-area, wafer-scale films of aligned carbon nanotubes can be deposited on the surface of the substrate in a continuous and scalable process. Because the methods use tangential flow and nanotube self-assembly at an interface, the methods are referred to as tangential flow interfacial self-assembly (TaFISA). Illustrative examples of TaFISA are provided in the Example.

The high carbon nanotube packing densities and degree of alignment that can be achieved using the methods render films made by the methods suitable for use in a variety of high-performance electronic applications, including as channel layers in FETs. Based, at least in part, on the discovery that the carbon nanotubes adopt a global nematic liquid crystal structure at the dynamic liquid/liquid interface, the inventors were able to identify interface cooling and deposition substrate tilt angle as variables that enabled exceptional carbon nanotube alignment in the deposited films.

The methods use a flow channel that is defined by a deposition substrate (also referred to as a "deposition wall" or "target substrate") upon which the organic material-coated carbon nanotube films are deposited, a confining substrate (also referred to as a "confining wall" or "barrier") disposed opposite the deposition wall and separated from the deposition wall by a gap, and a liquid that spans the gap between the deposition wall and the confining wall and serves as the floor of the flow channel. The liquid that provides the floor of the flow channel may be an aqueous liquid. For the purposes of this disclosure, the term aqueous liquid covers pure water, as well as aqueous solutions in which one or more solutes are dissolved in water and solution that include one or more organic cosolvents, in addition to water. For example, solutes that depress the melting point of the water or the aqueous cosolvent mixture, or antibacterial agents may be dissolved in the liquid. Alternatively, the liquid that provides the floor of the flow channel may be a non-aqueous liquid, such as an organic solvent, including fluorinated and non-fluorinated organic solvents, or a mixture of two or more organic solvents.

A dispersion of organic material-coated carbon nanotubes (also referred to as a CNT ink), which is immiscible with the underlying liquid that provides flow channel floor, is flowed over the surface of said underlying liquid. The dispersion includes a liquid in which the organic material-coated carbon nanotubes are dispersed. The liquid of the dispersion can be aqueous, as described above, or non-aqueous. Non-aqueous liquids include organic solvents, such as fluorinated and non-fluorinated organic solvents, or a mixture of two or more organic solvents.

As the dispersion flows, the carbon nanotubes dispersed within it become concentrated at the interface formed between the liquid dispersion and the underlying liquid floor and aligned along the liquid flow direction by shear forces. The underlying liquid is actively cooled in order to promote the global assembly of the carbon nanotubes into 2D nematic liquid crystal structures at the liquid/liquid interface. As the deposition wall is translated across the liquid/liquid interface, the aligned carbon nanotubes within the interface are deposited onto the surface of the deposition wall to form an aligned carbon nanotube film.

The film deposition process and examples of apparatus that can be used to carry out the process are shown in FIGS. 1B, 1C, 1E, and 1F. As illustrated in FIG. 1B, a dispersion of carbon nanotubes in a first liquid is flowed through a channel formed by the deposition wall and the barrier wall. The lower ends of the deposition wall and the barrier wall are submerged in a second liquid, such that the second liquid forms a liquid floor between the two walls. The second liquid is cooled and maintained at a temperature of 15° C. or lower to promote the formation of a liquid-crystal phase of carbon nanotubes at the interface. The second liquid can be cooled by, for example, immersing the container in which the second liquid is contained in an ice bath or other cooled liquid bath, by placing the container or the second liquid in contact with a cooling coil, cooling block, or a cooling dry bath, and/or by exposing the container or the second liquid to refrigerated air. In some variations of the methods, the second liquid is cooled to the temperature of 10° C. or lower. However, in order to prevent the first and second liquids from freezing, the temperature should be maintained above the freezing points of the liquids. Thus, for embodiments where the liquid is water, the temperature of the liquid should be higher than 0° C. The flowing thin film of the dispersion is cooled by the underlying second liquid. The dispersion can also be pre-cooled to a sub-ambient temperature to facilitate the alignment process.

Figure 1C:
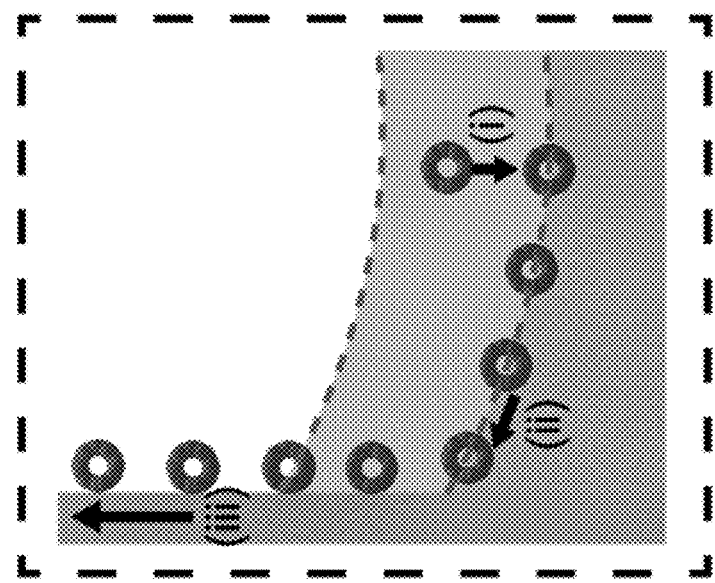
FIG. 1C shows a magnified view of a non-aqueous dispersion/water interface and CNTs within the liquid/liquid interface. In this process, CNTs collect from the bulk ink at the dispersion/water interface (i) and deposit on the substrate (ii), yielding wafer-scale films of aligned CNTs (FIG. 1D) as the substrate is lifted (iii).

As the liquid dispersion flows through the channel, aligned carbon nanotubes become adhered to the surface of the deposition wall where the liquid/liquid interface makes contact with the deposition wall. When the deposition substrate is translated across the liquid/liquid interface, a film of aligned carbon nanotubes is formed on the deposition substrate surface (FIG. 1C). Translating the deposition substrate across the liquid/liquid interface may be achieved by moving the deposition substrate in a direction perpendicular to the liquid/liquid interface as the liquid dispersion of carbon nanotubes is flowing through the channel, or by changing the position of the liquid/liquid interface relative to the deposition substrate as the liquid dispersion is flowing through the channel.

Figure 1E:
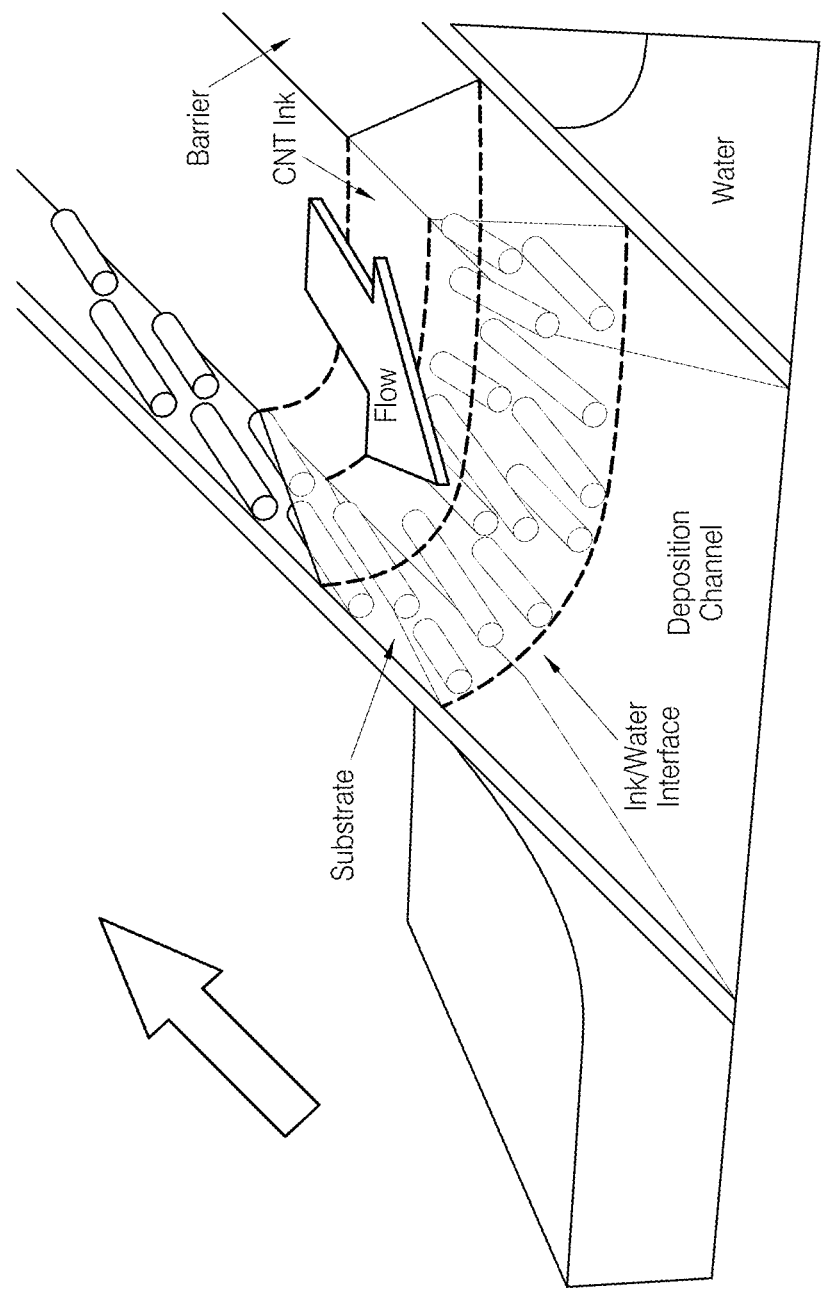
FIG. 1E shows an apparatus for the deposition of a film of aligned CNTs using a deposition substrate tilt angle of 45°.
Figure 1F:
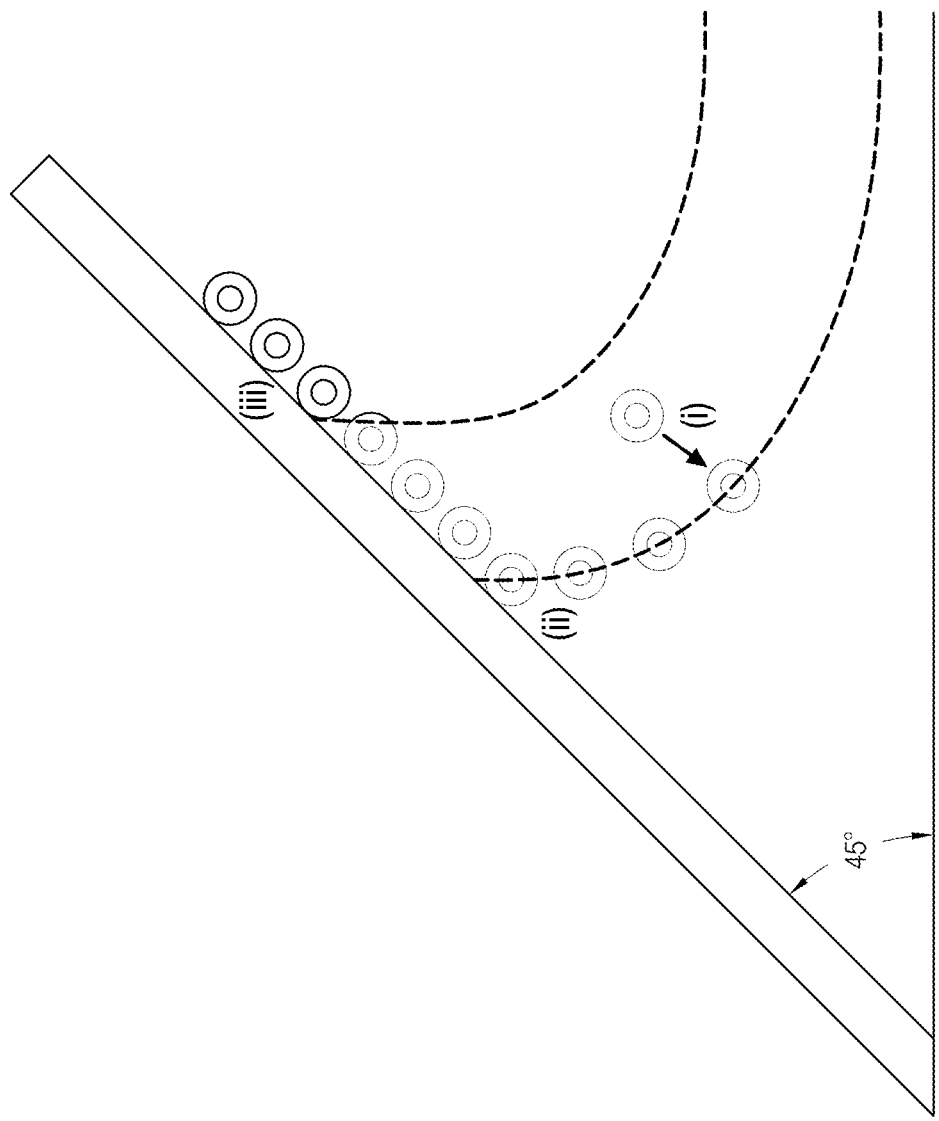
FIG. 1F shows a cross-sectional view of CNTs (circles) being deposited from the liquid/liquid interface onto a tilted deposition substrate using the apparatus of FIG. 1E.

In the embodiment of the apparatus and method shown in FIGS. 1B and 1C, the deposition wall and the barrier wall are oriented vertically with respect to the liquid floor of the channel. FIGS. 1E and 1F illustrate a variation of the apparatus and method in which the deposition wall and the barrier wall are tilted, such that the deposition wall extends over the liquid floor. The angle defined between the deposition surface of the deposition substrate and the global horizontal surface of the second liquid, referred to as a tilt angle, in FIGS. 1E and 1F is 45°. However, other tilt angles, including tilt angles in the range from 5° to 85° (for example, 10° to 70° or 15° to 60°), can be used. Without intending to be bound to any particular theory with respect to this aspect of the invention, the improvement in alignment for a tilted deposition substrate may be explained as follows: at dispersion flow rates that yield high global alignment of the carbon nanotube domains, the dispersion translates more smoothly across the surface of the translating deposition substrate (resulting in the deposition of more uniform assemblies of aligned organic material-coating carbon nanotubes) when the surface of the deposition substrate is tilted relative to the horizontal surface of the liquid floor of the flow channel.

In order to increase the carbon nanotube alignment within the liquid/liquid interface and the deposited films, the methods can combine the tilted deposition substrate with the liquid/liquid interface cooling described herein.

The dimensions of the flow channel used in the methods may be designed to provide a flow velocity gradient in the liquid dispersion of carbon nanotubes, wherein the flow velocity is at a minimum at the substrate surfaces and highest at or near the center of the flow. By way of illustration, some embodiments of the channels have a maximum spacing (gap) between the deposition substrate and the confining substrate of 5 mm or shorter, including 3 mm or shorter, and further including 1 mm or shorter. For example, spacings in the ranges from 0.05 mm to 5 mm and from 0.1 mm to 3 mm can be used. However, the methods are not limited to gap spacing in these ranges. The length of the channel is not particularly limited and can be selected to provide a carbon nanotube film over a desired surface area. By way of illustration, some embodiments of the channels have lengths of at least 1 mm, at least 10 mm, at least 100 mm, at least 1 m, or larger. Using the present methods, such large area films can be deposited quickly. By way of illustration, films can be deposited at a rate of 10 $cm^2$ per minute, 100 $cm^2$ per minute, 1000 $cm^2$ per minute, or faster.

For more uniform carbon nanotube films, the flowing liquid dispersion of carbon nanotubes should be maintained at a constant thickness and flow rate. The flow rate should be sufficiently high to provide shear-induced alignment of the 2D liquid crystal-like carbon nanotube domains, but not so high that the carbon nanotube domains are degraded. Generally, flow rates in the range from 2 mL $min^{-1}$ to 10 mL $min^{-1}$ are suitable. However, flow rates outside of these ranges can be used for less demanding applications. The thickness of the flowing layer of dispersion may be submillimeter; for example, thicknesses in the range from about 0.1 mm to 1 mm are suitable. However, thicknesses outside of this range can be used.

Prior to the onset of film deposition, it may be advantageous to allow the flow of the liquid dispersion to develop a uniform flow rate and profile. This is illustrated in FIGS. 1C and 1E, which depict the stages of dispersion flow. The liquid dispersions are introduced into the channel at position (i). The flow develops between positions (i) and (ii). Between positions (ii) and (iii), the flow is uniform, and aligned carbon nanotubes are uniformly deposited onto the deposition substrate as it was withdrawn from the second liquid. Optionally, in order to avoid film formation immediately after the liquid dispersion is introduced into the channel, wafer holders that allow the flow to fully develop prior to contacting the liquid/liquid interface to the deposition substrate and that control meniscus curvature to avoid end-effects can be used.

The surface of the deposition substrate is desirably composed of a material to which the organic material-coated carbon nanotubes readily adhere. Different deposition substrate materials may be preferred for different carbon nanotube coating materials. In some embodiments of the methods, hydrophilic substrates such as silicon or silicon oxide (e.g., $SiO_2$) can be used. In other embodiments, non-hydrophilic substrates or hydrophobic substrates can also be used. As used herein, a hydrophilic surface is a surface having a water contact angle of less than 90° and a hydrophobic surface is a surface having a water contact angle of greater than 90°. Contact angles can be measured using the static sessile drop method at 23° C. Other deposition substrate materials that can be used include metal oxides (including, but not limited to, aluminum oxide, hafnium oxide, and lanthanum oxide), high-k dielectric materials, such as SiN, and semiconductor materials, such as germanium. The deposition substrate can also be an organic polymer substrate for flexible electronics applications, including, but not limited to, polydimethylsiloxane, polyethersulfone, poly(ethylene terephthalate), and the like. These materials may compose the deposition substrate or may be applied as coatings over a bulk substrate base.

The confining substrate material is desirably, but not necessarily, selected such that the carbon nanotubes adhere less readily to the surface of the confining substrate than to the surface of the deposition substrate. Thus, different confining substrate materials may be preferred for different carbon nanotube coating materials. By way of illustration only, for organic material-coated carbon nanotubes that adhere well to a hydrophobic deposition substrate, the confining wall may be composed of a material that is less hydrophobic than the material from which the deposition wall is composed. Similarly, for organic material-coated carbon nanotubes that adhere well to a hydrophilic deposition substrate, the confining wall may be composed of a material that is less hydrophilic than the material from which the deposition wall is composed. Examples of suitable materials for the confining substrate include, but are not limited to, fluoropolymers, such as polytetrafluoroethylene and Viton, and glass or quartz coated with a hydrophobic polymer. Uncoated glass and quartz can also be used. It is not necessary to eliminate the deposition of carbon nanotubes on the confining wall. However, if deposition of the carbon nanotubes on the confining substrate is significant, it may be desirable to periodically replace the confining substrate or to clear the confining substrate of the deposited carbon nanotubes.

Optionally, the second liquid defining the flow channel floor can be flowed in the same direction as the liquid dispersion of carbon nanotubes. A flowing layer of the second liquid can be provided below the liquid dispersion by introducing the second liquid into the channel through a separate input port. An advantage of using a flowing liquid floor having a flow rate faster than that of the liquid dispersion is that it reduces the drag on the dispersion, which can result in better laminar flow and, therefore, better alignment of the carbon nanotubes in the deposited film.

Although the methods can be used to form films of carbon nanotubes having a variety of dimensions and electronic properties, they are particularly suited for forming films of aligned single-walled carbon nanotubes (SWCNTs) and, more particularly, semiconducting SWCNTs (s-SWCNTs), as films s-SWCNTs are particularly useful in electronics applications. The SWCNTs may be processed from high pressure carbon monoxide (HiPco) produced powders, via arc-discharge methods, or by other methods. The carbon nanotubes are typically characterized by very small diameters; for example, less than 5 nm and more typically less than 2 nm. Carbon nanotubes of various lengths can be aligned using the methods. For example, the SWCNTs in a sample used to form the films may have an average length (or a maximum length) of 5 µm or shorter. This includes very short carbon nanotubes that have lengths of no greater than 3 µm, or even no greater than 1 µm. In a sample (e.g., powder) of carbon nanotubes in which the dimensions of the individual carbon nanotubes vary, the dimensions recited above refer to the average dimensions for the carbon nanotubes in the sample. However, the samples can be selected such that none of the carbon nanotubes in the sample exceed the maximum dimensions recited above. For some device applications that require the carbon nanotubes to be only or predominantly s-SWCNTs, the SWCNTs used in the methods can be pre-sorted to remove all, or substantially all (e.g., >90%), of the metallic SWCNTs (m-SWCNTs).

The individual carbon nanotubes can be coated with an organic material in order to facilitate their alignment and deposition onto a substrate. This coating may also serve to avoid aggregation in the liquid dispersion or in the deposited film. For clarification, the organic material-coated carbon nanotubes each have a partial or complete film of an organic material on their surface (FIG. 1A); the carbon nanotubes are not all distributed in a continuous organic (e.g., polymer) matrix. The coatings may be, but need not be, covalently bonded to the surfaces of the carbon nanotubes. Organic materials that form the coatings include monomers, oligomers, polymers, and combinations thereof. The coating may be a coating that was used in a pre-sorting step to isolate s-SWCNTs from a mixture of s-SWCNTs and m-SWCNTs. These types of coatings are referred to herein as semiconductor-selective coatings. A number of semiconductor-selective coatings are known, including semiconductor-selective polymer coatings. Descriptions of such polymers can be found, for example, in Nish, A.; Hwang, J. Y.; Doig, J.; Nicholas, R. J. Highly selective dispersion of single-walled carbon nanotubes using aromatic polymers. *Nat. Nanotechnol.* 2007, 2, 640-6. The semiconductor-selective polymers are typically organic polymers with a high degree of π-conjugation and include polyfluorene derivatives, such as poly (9,9-dialkyl-fluorene) derivatives, and poly(phenyl vinylene) derivatives. While the semiconductor-selective coatings may be conductive or semiconductive materials, they can also be electrically insulating. Optionally, the coatings can be removed from the carbon nanotubes after the carbon nanotube films have been deposited. The coatings can be selectively dissolved or etched away. Alternatively, for polymers having a bi-pyridine repeat unit, the coatings can be removed via exposure to a transition metal salt, such as a transition metal (e.g., rhenium) carbonyl salt, as described in U.S. Pat. No. 9,327,979.

The carbon nanotubes are dispersed in aqueous or non-aqueous liquid provide a liquid dispersion of the carbon nanotubes. The carbon nanotubes may be pre-coated with the organic material, or the organic material may be included in the liquid. For embodiments that use organic solvents, a wide variety of organic solvents and mixtures of organic solvents can be used to form the dispersion, provided that the solvents are able to disperse the organic material-coated carbon nanotubes. The organic solvent desirably has a relatively high boiling point at the film deposition temperature and pressure, such that the solvent(s) evaporate slowly on the time-scale of the carbon nanotube dispersion transit time through the flow channel. Examples of organic solvents having relatively high boiling points include toluene and 1,2-dichlorobenzene. However, lower boiling organic solvents, such as chloroform, can also be used.

The concentration of the carbon nanotubes in the liquid dispersion may affect the density of the carbon nanotubes in the deposited arrays. At low concentrations, sparse films of randomly oriented carbon nanotubes are formed. Carbon nanotube ordering improves with increasing concentration (and with decreasing temperature) due to the underlying liquid crystal phenomena. However, at high concentrations, films comprising multilayers of the carbon nanotubes are deposited. Sub-monolayer carbon nanotube coverage at intermediate carbon nanotube packing densities is generally preferred for high-performance electronics. This can be achieved by careful control of the carbon nanotube concentration in the dispersion. By way of illustration, in order to form sub-monolayer films of aligned carbon nanotubes as 2D liquid crystals, liquid dispersion having carbon nanotube concentrations in the range from 5 μg mL$^{-1}$ to 200 μg mL$^{-1}$, or even higher, are suitable. However, concentrations outside of this range may be used for less demanding applications and the maximum achievable concentration will depend, at least in part, on the particular organic material coating the carbon-nanotubes.

The present methods do not require that all of the deposited carbon nanotubes be aligned, only that the average degree of alignment of the carbon nanotubes in the film is measurably greater than that of a film of randomly oriented carbon nanotubes. The degree of alignment of the carbon nanotubes in the films refers to their degree of alignment along their long axes within a film, which can be quantified using the methods described in the Example. In some embodiments, the deposited films have a carbon nanotube mean degree of alignment of ±10° or better. (That is, the mean of the magnitude of misalignment for the carbon nanotubes in the film is no greater than 10°.) This includes films in which the carbon nanotubes have a mean degree of alignment of ±6° or better. Notably, for some electronic device applications, such as channel layers in thin film transistors, the minor extent of imperfect alignment provided by the present methods may be desirable in order to ensure continuous interconnectivity of the carbon nanotubes over a surface area having dimensions greater than the lengths of the carbon nanotubes.

The density of the carbon nanotubes in the deposited arrays can be controlled by a variety of factors, including the channel geometry, the concentration of carbon nanotubes in the liquid dispersion, and/or the duration of the deposition process.

The films can be deposited as highly uniform, sub-monolayer films over large surface areas, where a uniform film is a continuous film in which the carbon nanotubes are aligned along a substantially straight path, without domains of randomly oriented carbon nanotubes. The area over which the uniform carbon nanotube films can be formed is not particularly limited and can be sufficiently large to cover the surface of an entire semiconductor wafer. By way of illustration, carbon nanotube films can be deposited over surface areas of at least 1 mm$^2$, at least 10 mm$^2$, at least 100 mm$^2$, or at least 1 m$^2$.

Depending on the intended application of the carbon nanotube films, it may be desirable to define a pattern in the film. For example, the films can be patterned into a series of lines, an array of dots, and the like. The pattern can be defined in the film after it is formed. Therefore, some embodiments of the methods include a step in which the films are lithographically patterned using, for example, photolithography techniques. Alternatively, a pattern can be defined in the film as it is deposited by using a patterned deposition substrate having at least two surface domains, wherein the carbon nanotubes adhere more readily to one of the two surface domains than to the other. For example, selected areas on the surface of the deposition substrate can be coated or functionalized with a hydrophilic material and/or selected areas on the surface deposition substrate can be coated or functionalized with a hydrophobic material, such that the carbon nanotubes are preferentially deposited onto and aligned along the more hydrophilic domains or the more hydrophobic domains.

The nature of the pattern will depend on the intended application of the film. For example, if a film of aligned s-SWCNTs is to be used as the channel material in a FET, a pattern comprising a series of parallel stripes can be defined in the film. FETs comprising the films of aligned s-SWCNTs as channel materials generally comprise a source electrode in electrical contact with the channel material and a drain electrode in electrical contact with the channel material; a gate electrode separated from the channel by a gate dielectric; and, optionally, an underlying support substrate. Various materials can be used for the components of the FET. For example, a FET may include a channel comprising an array comprising aligned s-SWCNTs, a SiO$_2$ gate dielectric, a doped Si layer as a gate electrode and metal (Pd) films as source and drain electrodes. However, other materials may be selected for each of these components.

EXAMPLE

In this example, 2D nematic liquid crystals of nanotubes were obtained by applying continuous, well-defined ink layers with constant thickness and flow velocity to the surface of an aqueous subphase. The nanotubes collected at the interface, forming sub-monolayer 2D liquid crystals over a window of bulk ink concentrations ranging from 5 to 200 μg mL$^{-1}$. Sparse films of randomly oriented nanotubes and thicker multilayers of nanotubes were obtained at concentrations below and above this window, respectively.

Figure 2C:
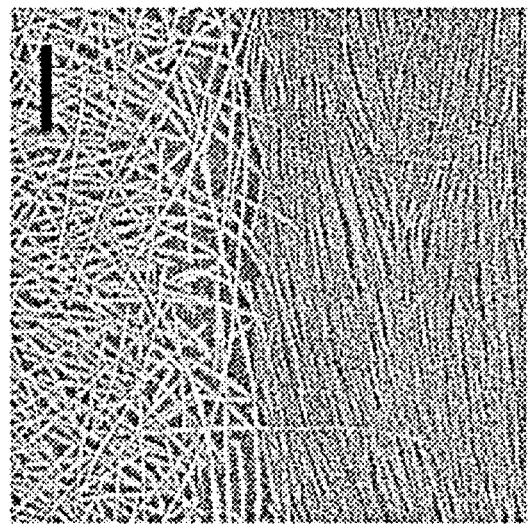

The carbon nanotubes were semiconducting single-walled carbon nanotubes wrapped with poly[(9,9-dioctylfluorenyl-2,7-diyl)-alt-co-(6,6'-{2,2'-bipyridine})]. The 2D nematic crystals were formed using the apparatus of FIG. 1B and the experimental conditions listed in Table 1. Evidence of 2D nematic assembly phenomena is shown in FIG. 2A (without added flow) and FIG. 2B (with flow). Even without flow, locally ordered domains of densely aligned nanotubes were deposited onto the substrate (observed underneath spurious random nanotubes), distinct from the disordered films of randomly oriented nanotubes that were created by dip-coating substrates into bulk solutions of nanotube ink without the 2D liquid/liquid interface. The approximate domain boundaries are outlined in black, and the characteristic orientation within each domain (termed the director) is marked by arrows in FIG. 2A (lines are traces of representative nanotubes in domains). Without flow, the orientation of each domain was different, and the nanotubes lacked global order.

Figure 3A:
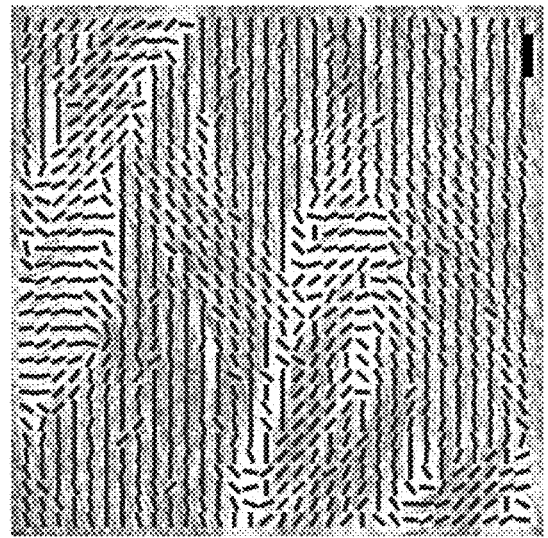
FIGS. 3A-3I show the effect of dispersion flow rate on ordering in CNT films made according to the methods described herein.
Figure 3B:
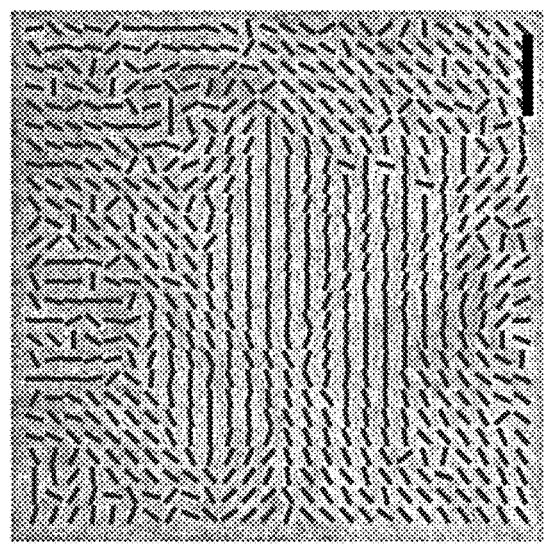
Figure 3C:
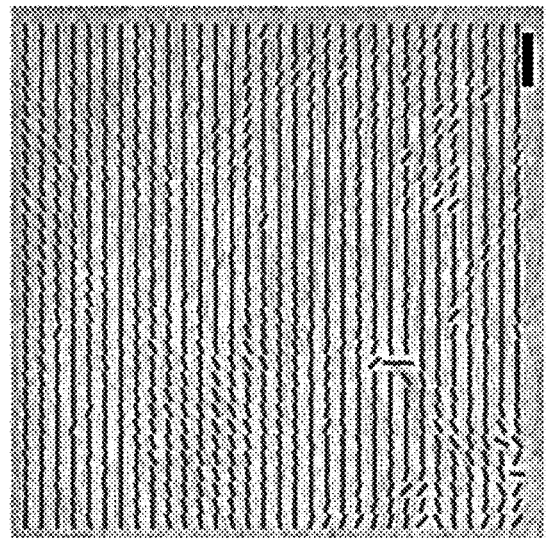
Figure 3F:
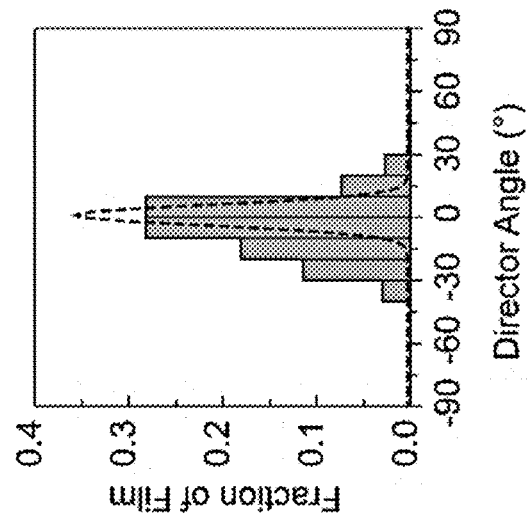
Figure 3E:
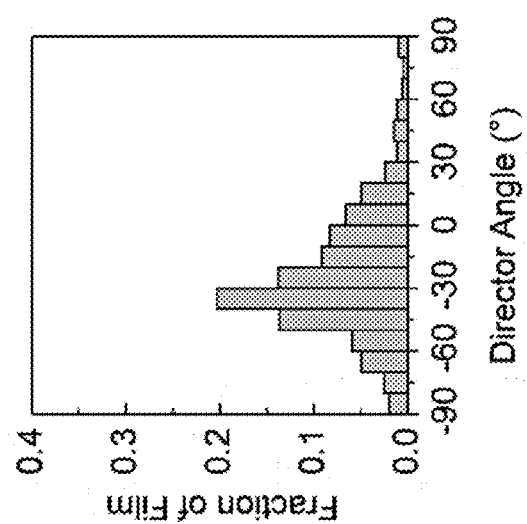
Figure 3D:
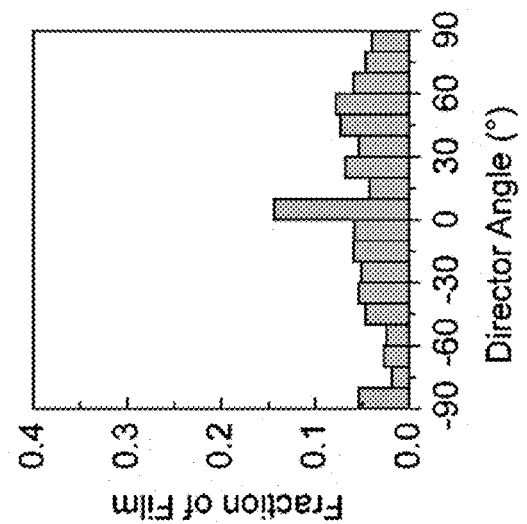

With increasing flow velocity, the local directors became more aligned with each other—even over large areas—as characterized and quantified in FIGS. 3A-3F. Large (greater than 6×6 µm$^2$) scanning electron microscopy (SEM) images of assemblies deposited using a volumetric flow rate of 0-, 1-, and 4-mL min$^{-1}$ are compared in FIGS. 3A, 3B, and 3C, respectively. 2D fast Fourier transforms were used to quantify and map local director orientation. (Brandley, E. et al., Carbon 137, 78-87 (2018).) This mapping was conducted on six different areas of each sample (FIGS. 6A-6F and FIGS. 7A-7C), and cumulative distributions of director orientations are shown in FIGS. 3D-3F.

TABLE 1

Summary of experimental conditions for each main text figure. Ink flow in TaFISA was continuous. Ink flow in FESA was drop-wise, where specified ink volumetric flow rates were time-averaged. A time-averaged flow rate of 0.175 mL min$^{-1}$ in FESA resulted in the dosing of 0.83 droplets of ink to the aqueous sub-phase per second. PEEK: Polyether ether ketone; PTFE: polytetrafluoroethylene.

| Figure | TaFISA | FESA | Ink Volumetric Flow Rate (mL min$^{-1}$) | Ink Concentration (µg mL$^{-1}$) | Substrate Lift Rate (mm min$^{-1}$) | Angle of Substrate/ Channel (°) | Ink Needle | Type of Substrate |
|---|---|---|---|---|---|---|---|---|
| 2A, 2D | X | | 0 | 100 | 26 | 90 | PEEK (OD: 1.59 mm; ID: 0.76 mm) | 90 nm SiO$_2$/highly p-type doped Si |
| 2B, 2E | X | | 4 | 100 | 26 | 45 | PEEK (OD: 1.59 mm; ID: 0.76 mm) | 90 nm SiO$_2$/highly p-type doped Si |
| 2C | | X | 0.175 | 30 | 5 | 90 | 32-gauge steel needle | 90 nm SiO$_2$/highly p-type doped Si |
| 2F, 2H | X | | 8 | 100 | 160 | 45 | PTFE coated steel needle (20 gauge) | 90 nm SiO$_2$/highly p-type doped Si |
| 3A, 3D, 3G | X | | 0 | 100 | 26 | 90 | PEEK (OD: 1.59 mm; ID: 0.76 mm) | 90 nm SiO$_2$/highly p-type doped Si |
| 3B, 3E, 3H | X | | 1 | 100 | 26 | 45 | PEEK (OD: 1.59 mm; ID: 0.76 mm) | 90 nm SiO$_2$/highly p-type doped Si |
| 3C, 3F, 3I | X | | 4 | 100 | 26 | 45 | PEEK (OD: 1.59 mm; ID: 0.76 mm) | 90 nm SiO$_2$/highly p-type doped Si |
| 4A-4D | X | | 4 | 0.1, 5, 100 | 160 | 45 | PTFE coated steel needle (20 gauge) | 90 nm SiO$_2$/highly p-type doped Si |
| 4E-4H | X | | 4 | 100 | 160 | 45 | PTFE coated steel needle (20 gauge) | 90 nm SiO$_2$/highly p-type doped Si |
| 5B, 5C | X | | 4 | 150; 80 | 40 | 45 | PTFE coated steel needle (20 gauge) | 15 nm SiO$_2$/highly p-type doped Si |

Figure 2B:
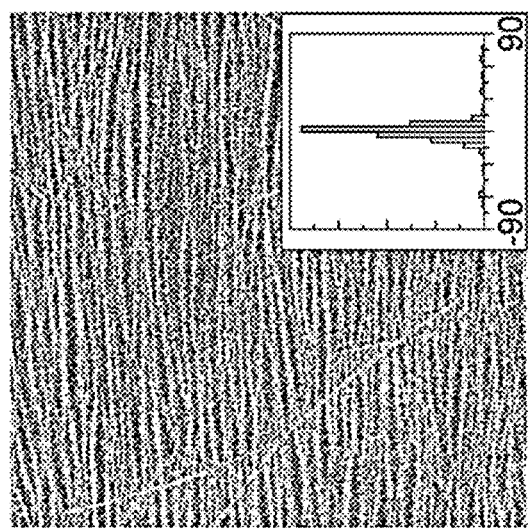
Figure 2A:
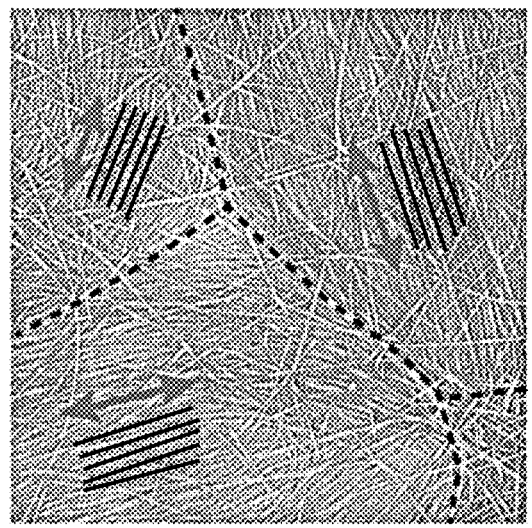
Figure 2E:
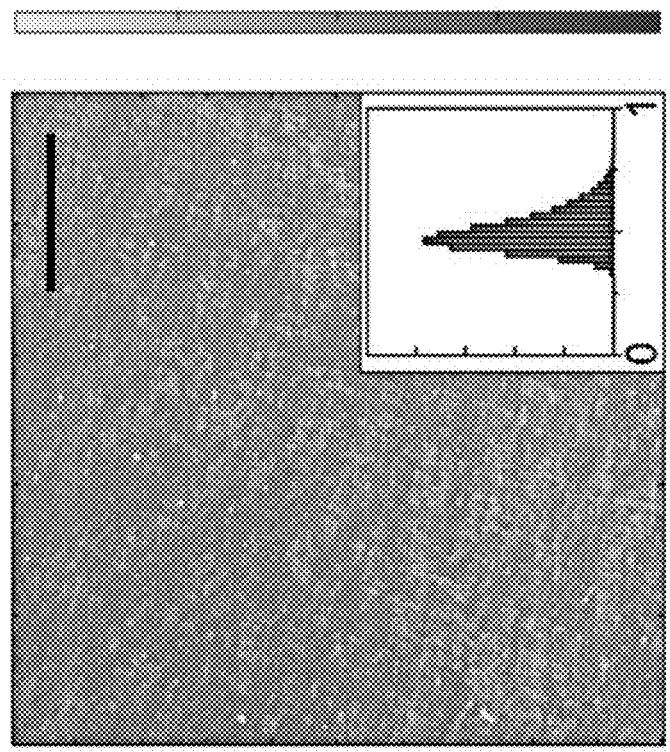
Figure 2D:
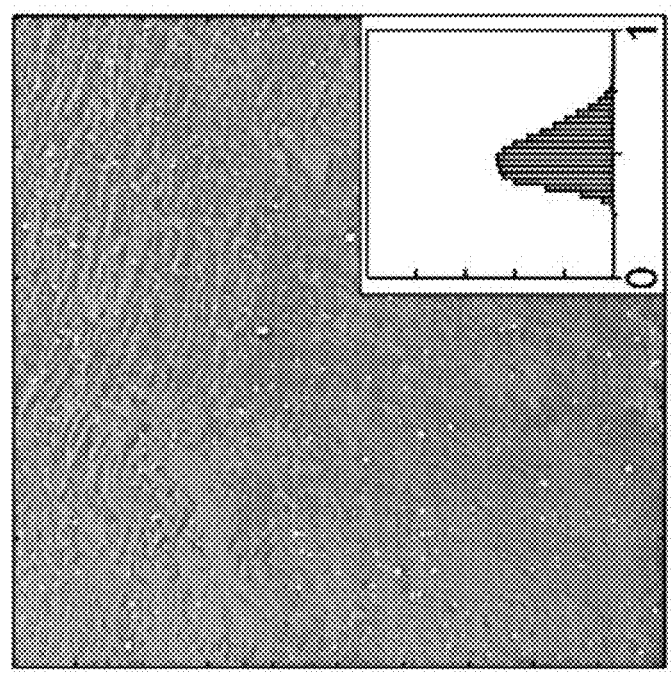

With flow, the domains globally aligned parallel to the direction of flow (FIG. 2B). On a 1.5×1.5 µm$^2$ scale, the alignment was excellent with a half-width at half-maximum (HWHM) in angular spread of 5.7° (calculated order parameter=0.90). This narrow spread was comparable to the excellent alignment observed in the striped regions of FESA (FIG. 2C); however, the TaFISA arrays were continuously deposited across the substrate. The continuous, uniform nature of TaFISA, both without and with flow, is evidenced by Raman spectroscopy maps of relative nanotube density in FIGS. 2D and 2E, respectively.

As discussed further below, the addition of flow enabled aligned arrays of carbon nanotubes to be deposited on the wafer-scale (FIGS. 2F-2H). FIG. 2F shows an optical image of a 10 cm wide wafer piece with TaFISA aligned nanotubes deposited across it. Overlaid are Raman spectroscopy maps of carbon nanotube density confirming nanotube deposition and alignment (FIG. 2H) across the region of developed flow (~60% of the wafer).

Without flow, the directors were oriented at all angles, showing a lack of global ordering but with local ordering in domains 3 to 30 µm in extent (FIGS. 3A,3D). With increasing flow (1 mL min$^{-1}$), a clear global preferential orientation appeared in the director distribution with a HWHM of 37.3° (FIGS. 3B, 3E); and, at high flow (4 mL min$^{-1}$), the distribution narrowed, with a HWHM of 16.1° centered around 0°—the direction of flow (FIGS. 3C, 3F). The spread in director orientation in TaFISA films (FIG. 3F) reduced at high flow rates, nearing that of the local nanotube orientation histogram (FIG. 2B inset and FIG. 3F dashed black line).

Figure 3I:
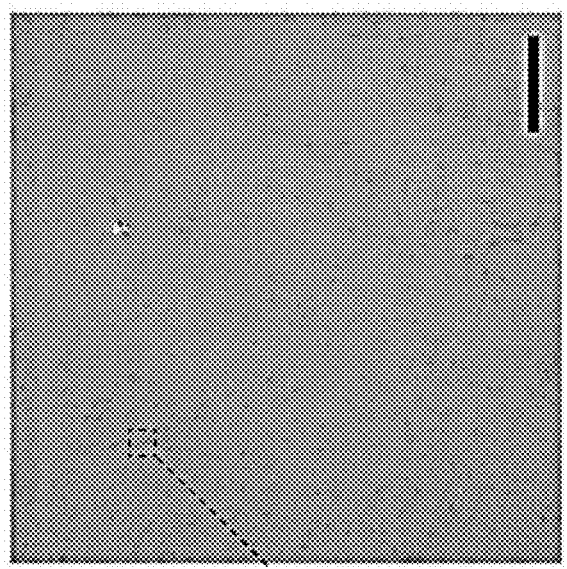
Figure 3H:
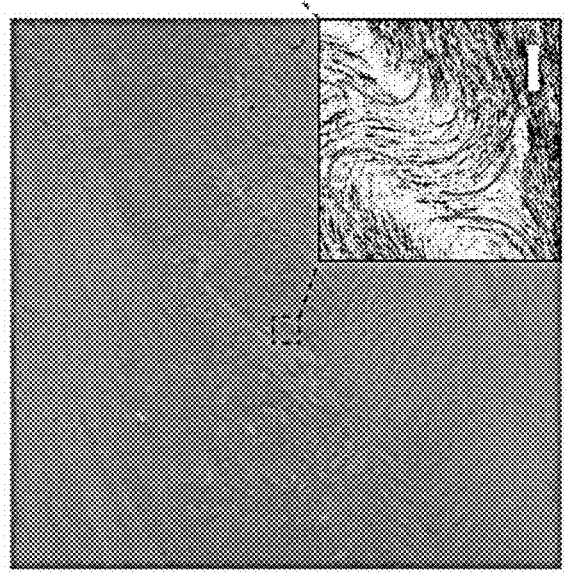
Figure 3G:

These trends were moreover qualitatively observed over an even larger scale (1.4×1.4 mm$^2$) in the POM images in FIGS. 3G-3I, where light grey corresponds to nanotubes aligned with the flow direction (horizontal) and darker regions correspond to misaligned nanotubes. The nanotube density can also be smaller in these darker regions. Without flow, the POM images are composed of roughly equal amounts of bright and dark regions indicating a lack of global uniformity and alignment (FIG. 3G). At intermediate flow (1 mL min$^{-1}$), the POM images became more homogeneous, and at a high flow (4 mL min$^{-1}$), the POM images were nearly uniform in intensity, with all nanotube domains oriented roughly with the flow direction and deviation limited to highly localized regions.

An SEM image of one of these highly localized darker regions is shown in FIG. 3H inset. These nanotube arrangements correspond to liquid crystal defects or disclination lines, i.e., locations where the director cannot be determined. Liquid crystal defects were characterized with a charge related to the direction and number of times the director rotated $2\pi$ after traversing a circle around the defect. The liquid crystal defects in FIG. 3H inset have charges of $-\frac{1}{2}$ (trio of darker curved lines in the lower portion of the inset) and $+\frac{1}{2}$ (pair of darker curved lines in the upper portion of the inset). The uniformity at a flow rate of 8 mL min$^{-1}$ was similar to that at 4 mL min$^{-1}$, with marginal increase in defects; however, increasing the flow rate to 16 mL min$^{-1}$ significantly deteriorated ordering, introduced more substantial defects, and resulted in incomplete coverage. Thus, there is a trade-off between shear-inducing alignment of the 2D liquid crystalline domains and assembly degradation.

Figure 4A:
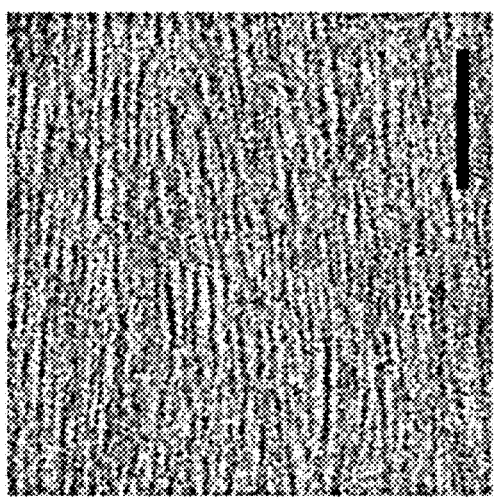
FIGS. 4A-4H show the effect of CNT concentration in the flowing dispersion and temperature on CNT film made in accordance with the methods described herein.
Figure 4B:
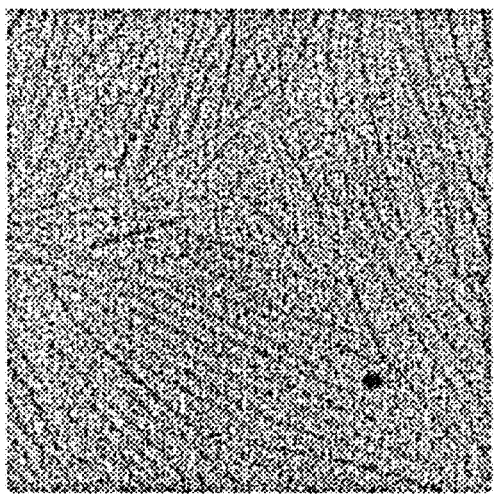
Figure 4C:
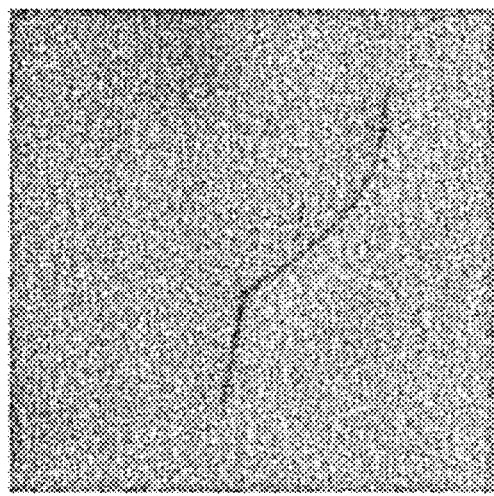
Figure 4D:
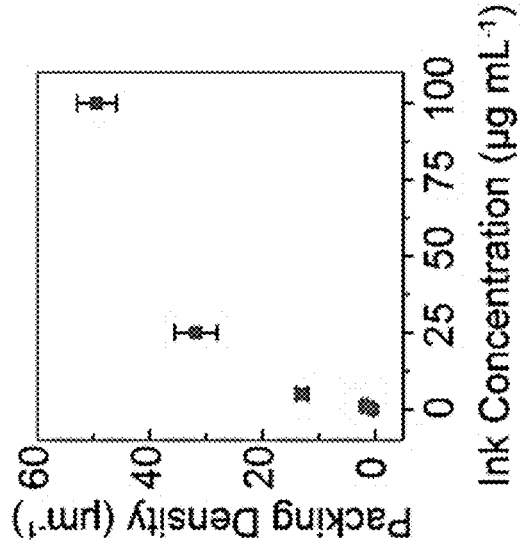

Ordering in TaFISA films dramatically improved with increasing concentration (FIGS. 4A-4C), indicating the importance of collective interactions among nanotubes and further evidencing underlying lyotropic liquid crystal phenomena. At low bulk ink concentrations of 0.1 µg mL$^{-1}$ (FIG. 4A), nanotubes that were poorly aligned and at a low density were deposited, despite the high flow rate (4 mL min$^{-1}$). Collective interactions began to create local order as the concentration increased to 5 µg mL$^{-1}$ (FIG. 4B) and then reached a high degree of order at a concentration of 100 µg mL$^{-1}$ (FIG. 4C). At higher ink concentrations, such as 200 µg mL$^{-1}$, the size of the defect regions increased—possibly because of increased heterogeneity within the ink caused by nanotube bundles and aggregates that form at elevated concentrations. The linear packing density of resolvable rod-like objects increased with bulk ink concentration, reaching 50±4 µm$^{-1}$ at an ink concentration of 100 µg mL$^{-1}$ near the intermediate density needed for carbon nanotube-based FETs (FIGS. 4C, 4D). Note that the density of nanotubes was likely higher than measured due to undercounting of individual nanotubes that were spaced by less than the resolution of the SEM.

The concentration dependence data informed about the mechanism and dimensionality of the underlying phenomena. In bulk solution, Onsager's rigid rod theory predicts the onset of liquid crystal assembly at a concentration of 13 mg mL$^{-1}$ (considering the dimensions of nanotubes used here). (Onsager, L. *N Acad Sci* 51, 627-659 (1949); and Khokhlov, A. R. et al., *Physica* 108A, 546-556 (1981).) Experimental work has observed liquid crystal behavior in bulk nanotube solutions at concentrations as much as an order of magnitude below the prediction of Onsager's theory. (Lee, H. W. et al., *Small* 5, 1019-1024 (2009).) In contrast, liquid crystal behavior emerged at dramatically lower concentrations in TaFISA, with optimal ordering obtained at 100 µg mL$^{-1}$ and nanotube ordering and liquid crystal defects ($-\frac{1}{2}$ defect seen in FIG. 4B) observed at concentrations as low as 5 µg mL$^{-1}$. The onset of nematic assembly at orders of magnitude lower concentration than theory and past experiments was a result of the 2D confinement and accumulation of nanotubes at the liquid/liquid interface. At the onset of nematic ordering at ink concentration of 5 µg mL$^{-1}$, the areal density of nanotubes deposited was 26 µm$^{-2}$. This areal density matches predictions for the onset of nematic ordering for a 2D system of rods of 28 µm$^{-2}$ (considering the dimensions of nanotubes used here), further confirming the centrality of the 2D liquid/liquid interface and liquid crystal assembly in TaFISA. (Czogalla, A. et al., *Nano Lett.* 15, 649-655 (2015).)

Figures 4E, 4F, 4G:
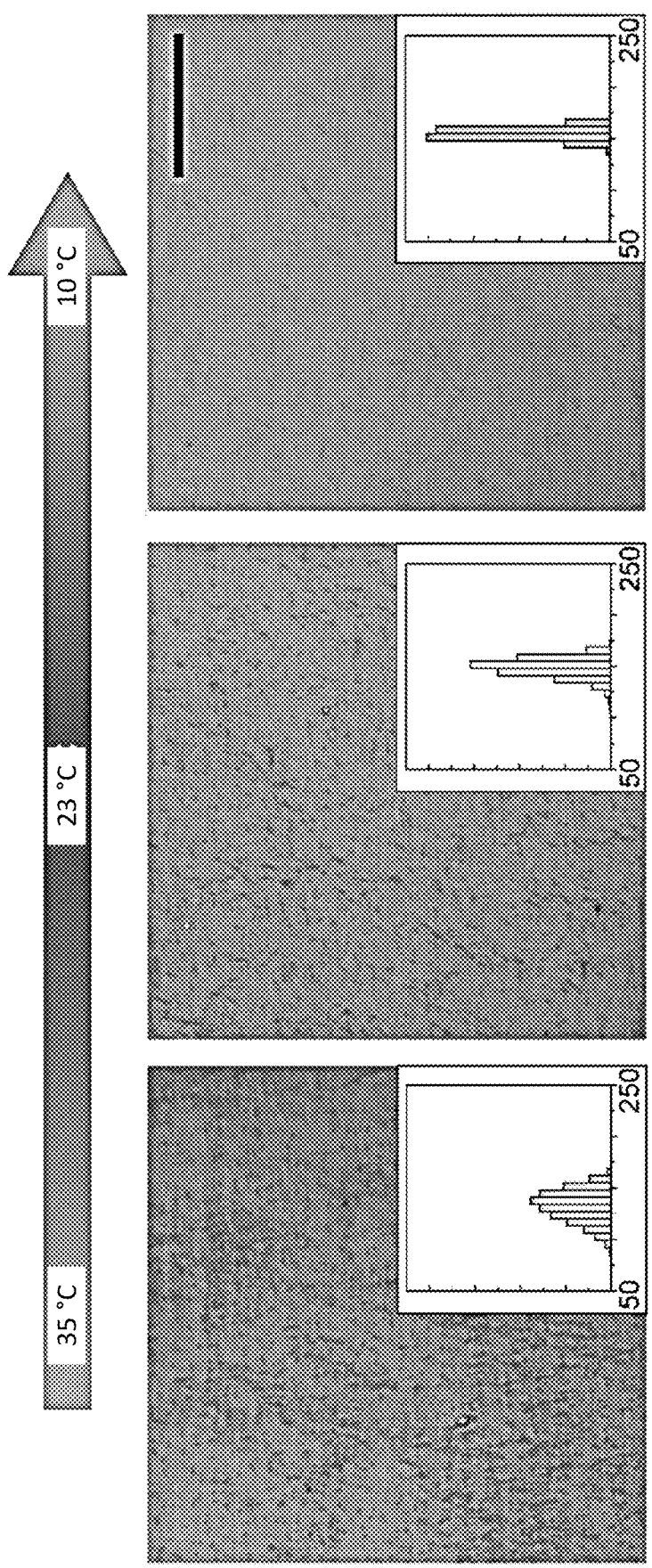
Figure 4H:
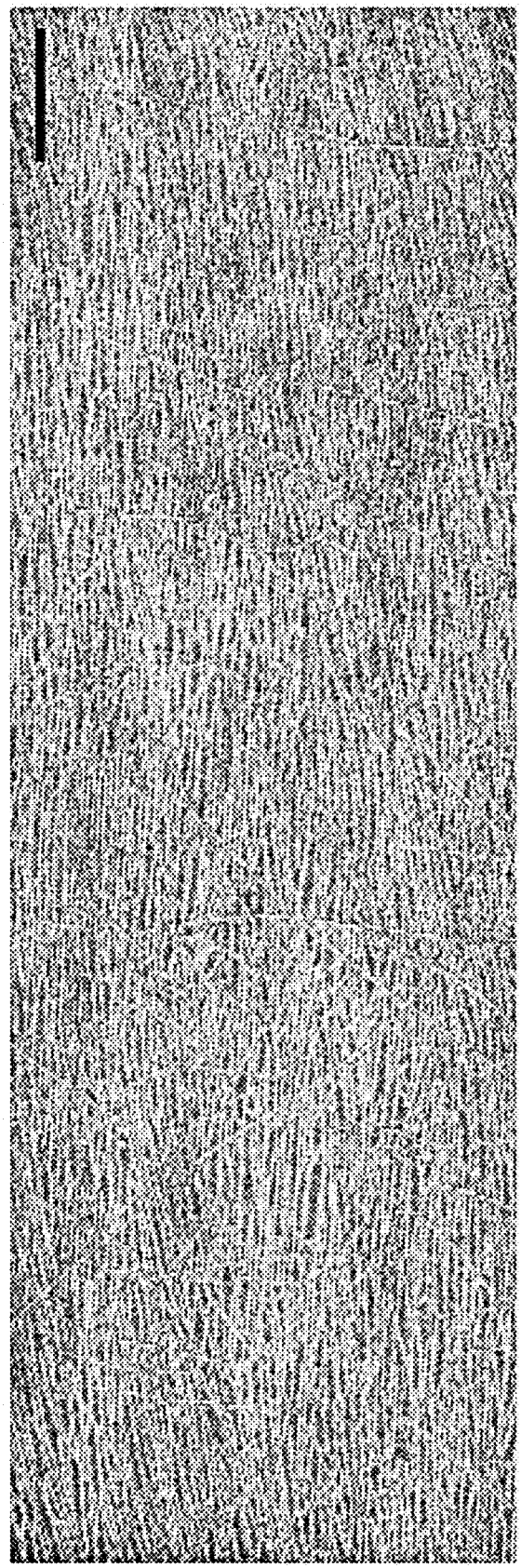

The continuous arrays of well-aligned nanotubes assembled by TaFISA (at optimized flow rate and ink concentration) were punctuated only by small regions of disorder, such as liquid crystal defects. Decreasing temperature provided a route to suppress this disorder, for example, by reducing thermal motion and increasing the relative importance of anisotropic van der Waals interactions among mesogens. The significant effect of temperature on TaFISA is clearly observed in the POM images presented FIGS. 4A-4H, which became strikingly more uniform by decreasing temperature from 35° C. (FIG. 4E) to 23° C. (FIG. 4F) to 10° C. (FIG. 4G). The figure insets quantify the distribution of POM pixel intensities, which converged to a uniform, tight distribution at 10° C., evidencing a substantial reduction in disorder and defects. The nanotube assemblies obtained at 10° C. were highly ordered both on a large scale (0.7×0.7 mm$^2$ area), as shown in FIG. 4G, and on a local scale, as shown in a corresponding SEM image in FIG. 4H.

Figure 5B:
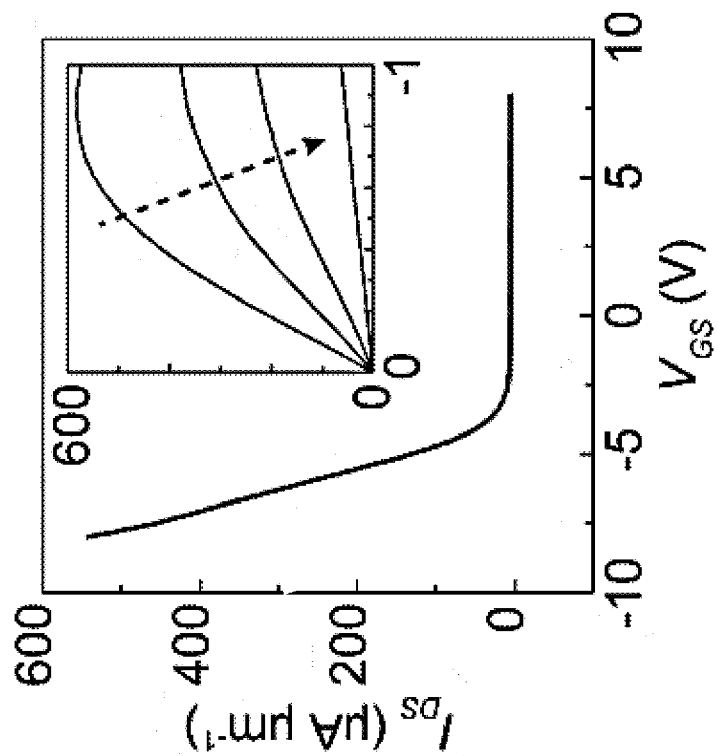
FIGS. 5A-5E show charge transport measurements of FETs fabricated using CNT films made in accordance with the methods described herein.
Figure 5A:
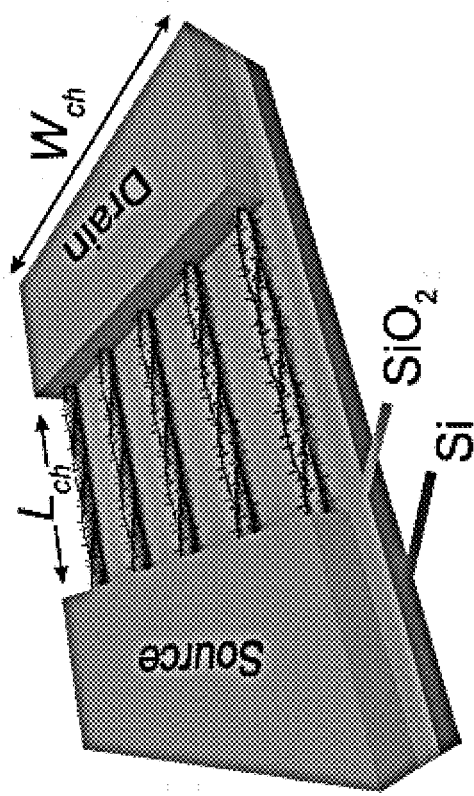

FET measurements demonstrate that TaFISA arrays had excellent and uniform electrical characteristics (FIGS. 5A-5E). FETs with 100-120 nm channel lengths were fabricated linearly across large-area assemblies of TaFISA nanotubes. Representative source-drain current ($I_{DS}$) versus gate-source bias ($V_{GS}$) characteristics are shown in FIG. 5B for back gated FETs, at source-drain bias ($V_{DS}$) of −1 V. FETs fabricated from TaFISA arrays are shown.

The back gated FETs (FIGS. 5A-5C) turned on at negative $V_{GS}$, typical of p-type nanotube FETs with Pd source and drain contacts measured in ambient air on SiO$_2$. Utilizing an ion gel top gate (FIGS. 5D, 5E) resulted in more ambipolar behavior, with excellent subthreshold swing of 60-173 mV decade$^{-1}$ approaching the Boltzmann limit at room temperature of 60 mV decade$^{-1}$.

The FIG. 5B inset shows representative $I_{DS}$ versus $V_{DS}$ characteristics for back gated TaFISA FETs, as $V_{GS}$ was varied from −8 to −2 V. Typical on-state current densities reached 520 µA µm$^{-1}$ (corresponding to 11 µA per nanotube) in TaFISA FETs at a $V_{DS}$ of −0.6 V (at a channel length of 110 nm) and then saturated at more negative $V_{DS}$. In the linear regime at small $V_{DS}$ of −0.1 V, the typical on-state conductance was 1100 µS µm$^{-1}$ (corresponding to 0.29 G$_0$ per nanotube, where G$_0$=2e$^2$ h−1=77 µS is the quantum conductance) demonstrating that charge transport in TaFISA arrays is approaching the quantum conductance limit of 2 G$_0$. The comparable on-state current achieved here evidences the exceptional charge transport properties inherent to TaFISA aligned arrays.

Figure 5C:
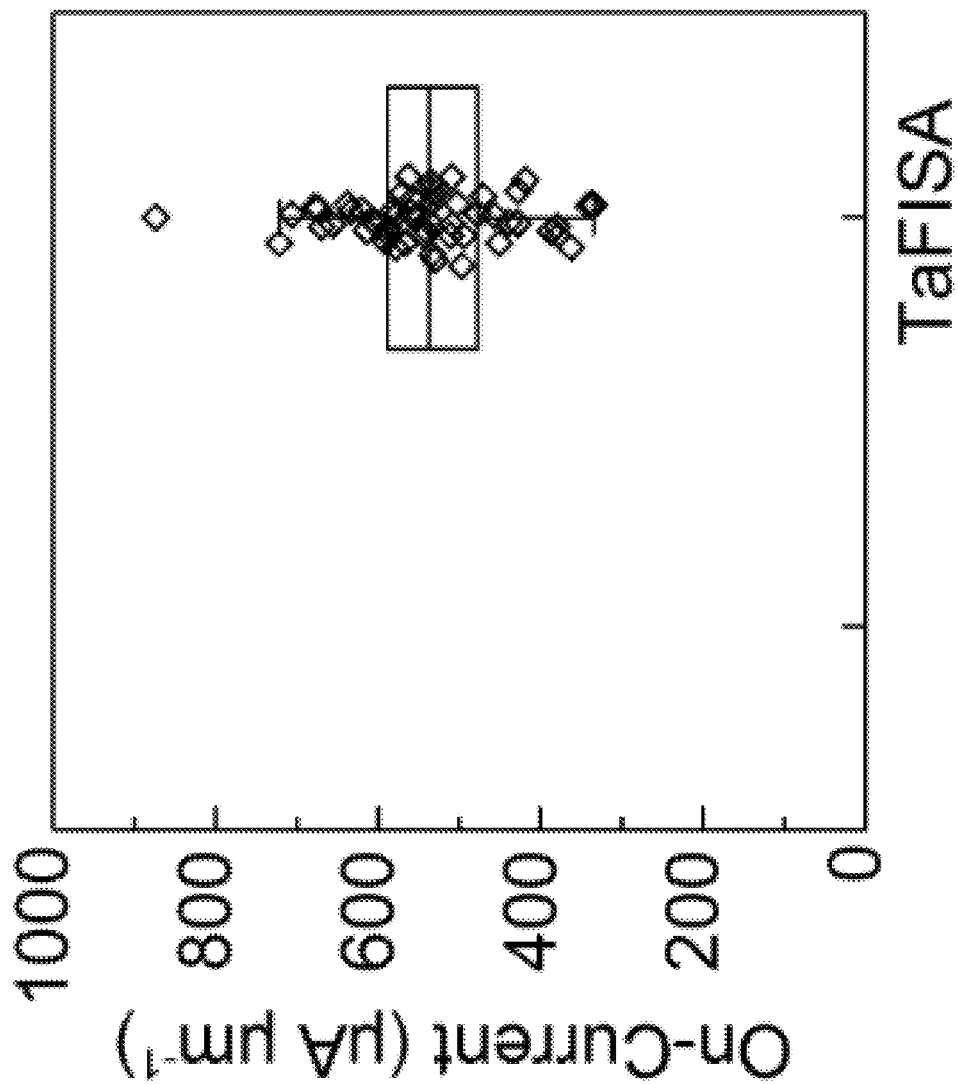
Figure 5E:
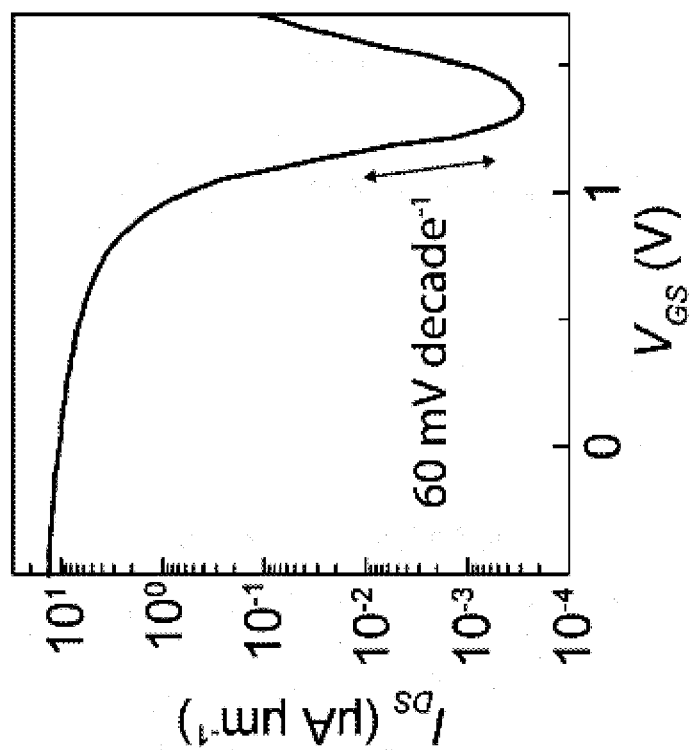
Figure 5D:
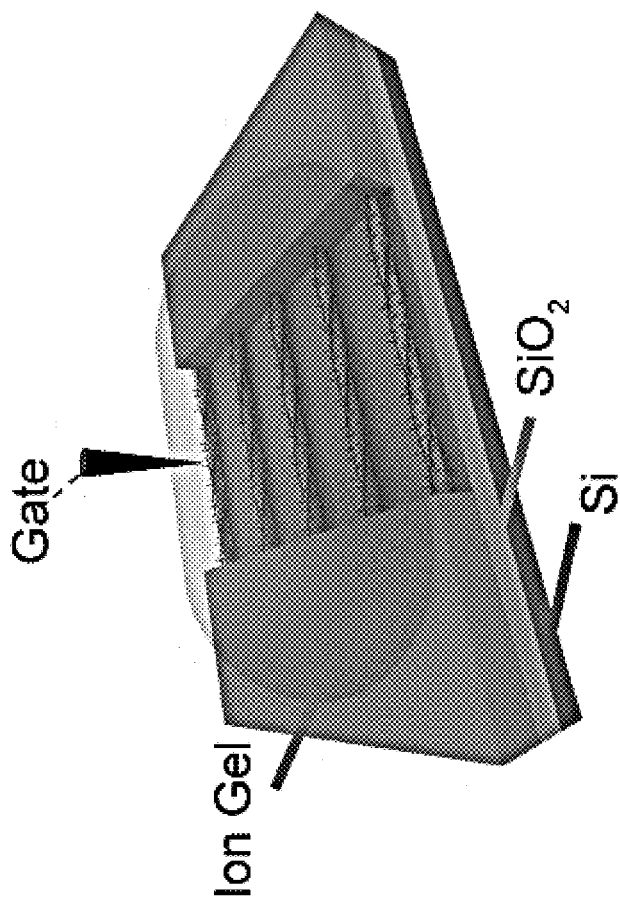
Figure 6A:
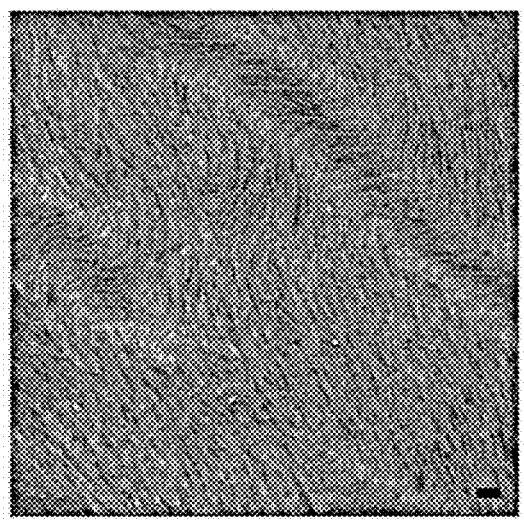
FIGS. 6A-6F show SEM images of nanotubes deposited at non-aqueous CNT dispersion volumetric flow rates of 0 (FIG. 6A), 1 (FIG. 6B), and 4 (FIG. 6C) mL $min^{-1}$ with local director orientations superimposed as dark segments, determined via local two-dimensional fast Fourier transform (FFT) analysis. Fourier transform window size for each local analysis was 20 pixels, or the length of each dark segment. Scale bars are 1 μm.
Figure 6A:
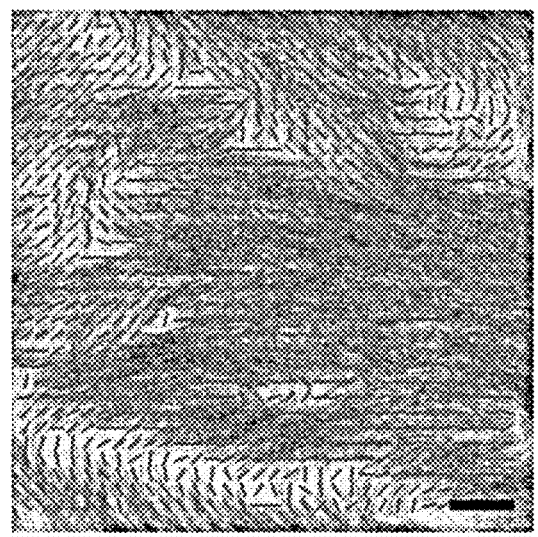
Figure 6A:
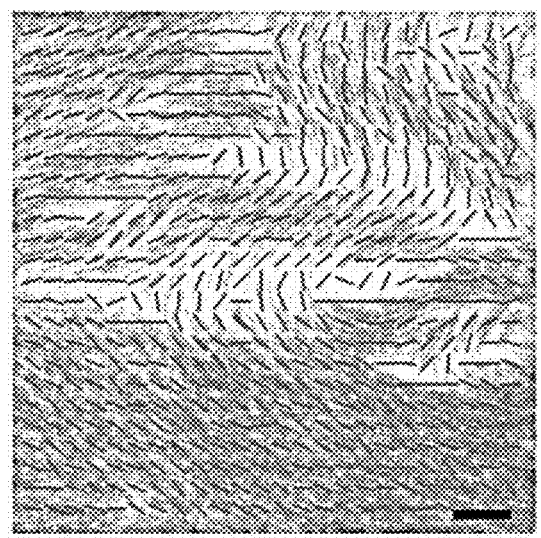
Figure 6B:
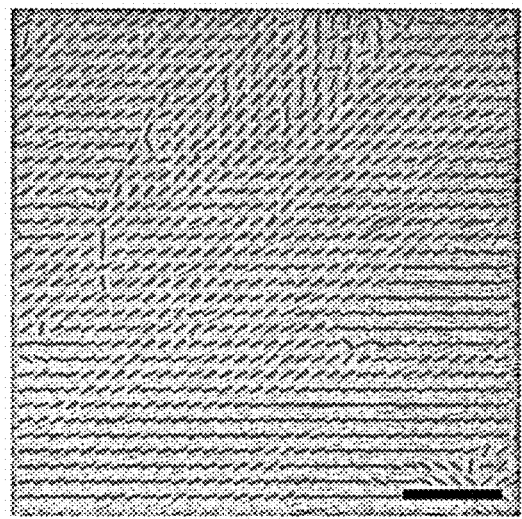
Figure 6B:
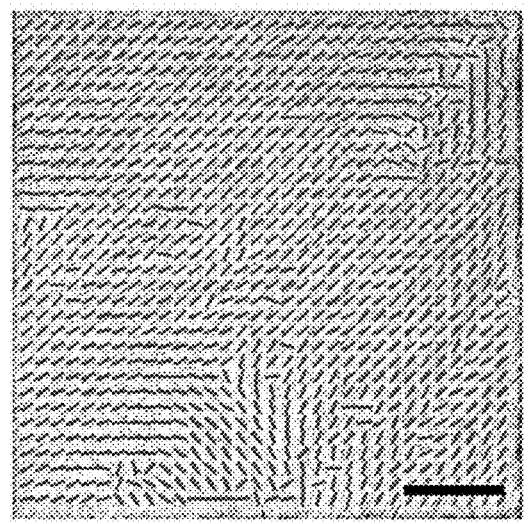
Figure 6B:
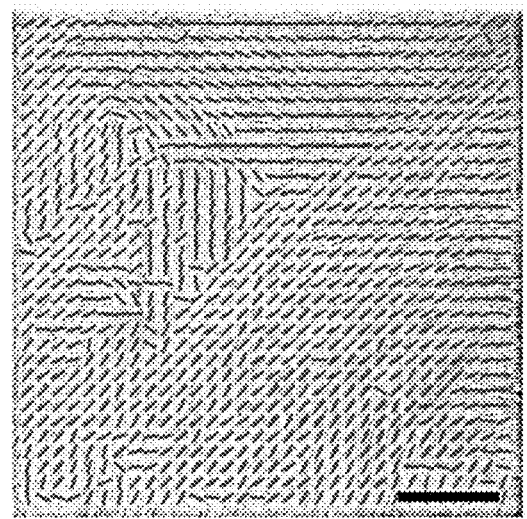
Figure 6C:
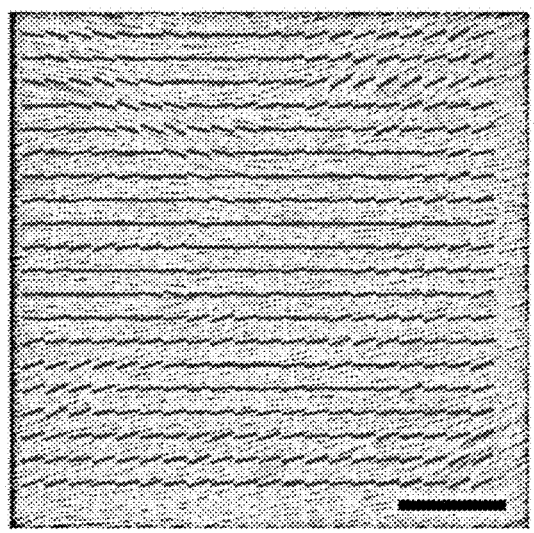
Figure 6C:
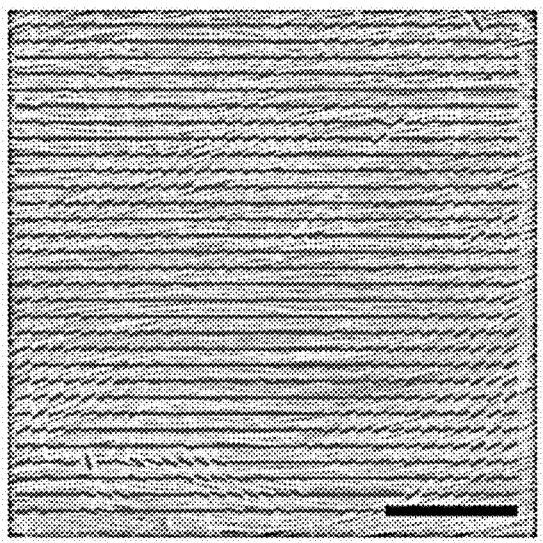
Figure 6C:
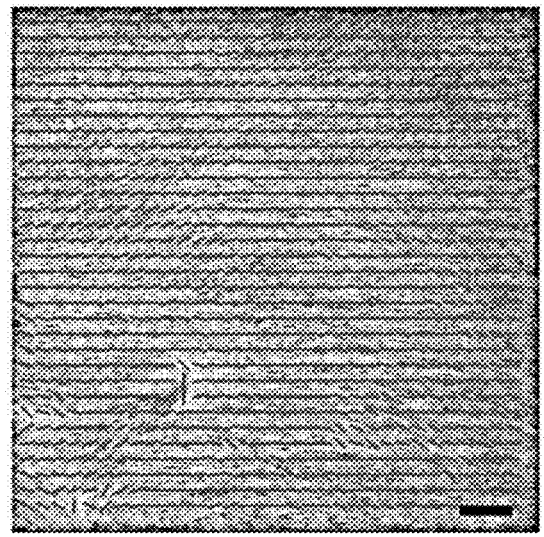
Figure 6D:
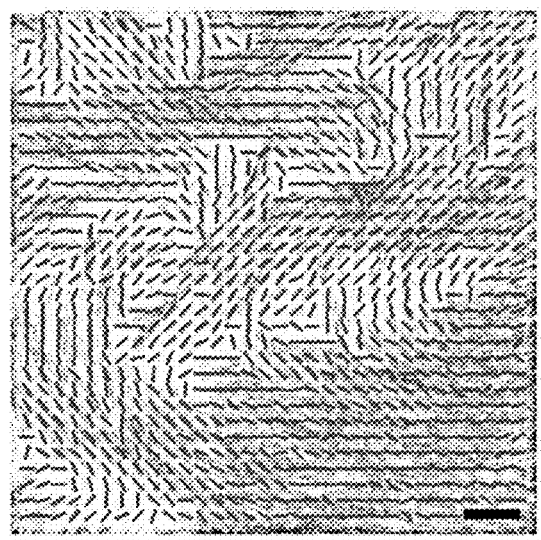
Figure 6D:
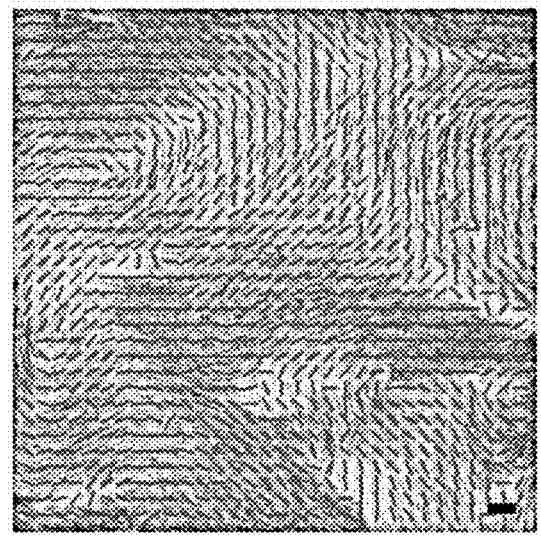
Figure 6D:
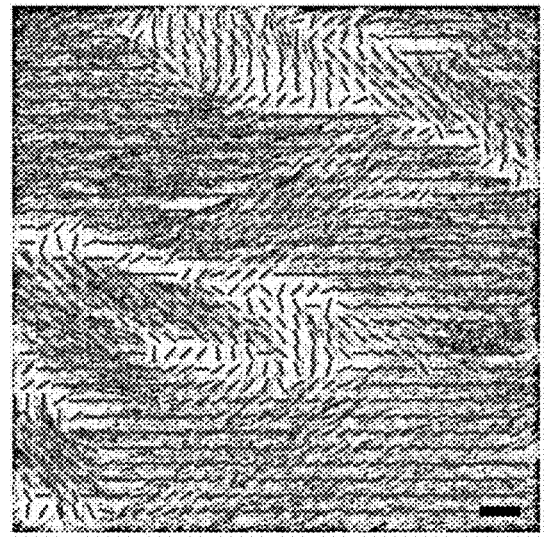
Figure 6E:
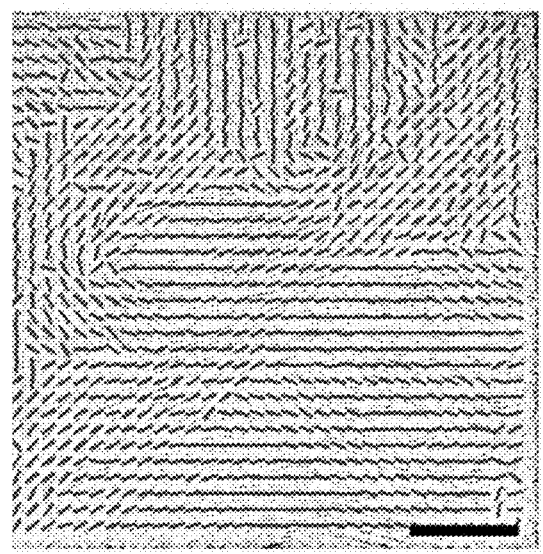
Figure 6E:
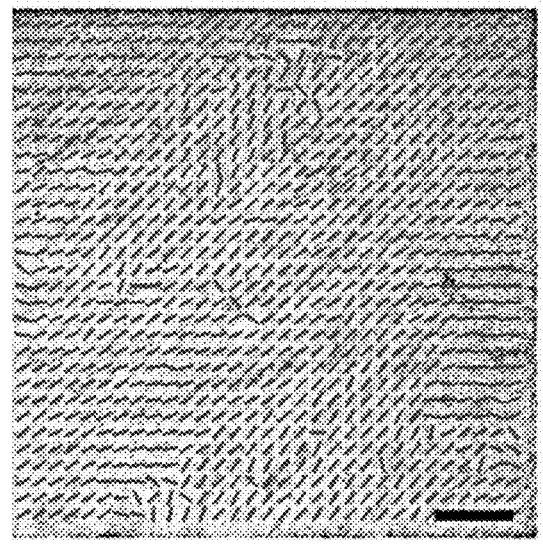
Figure 6E:
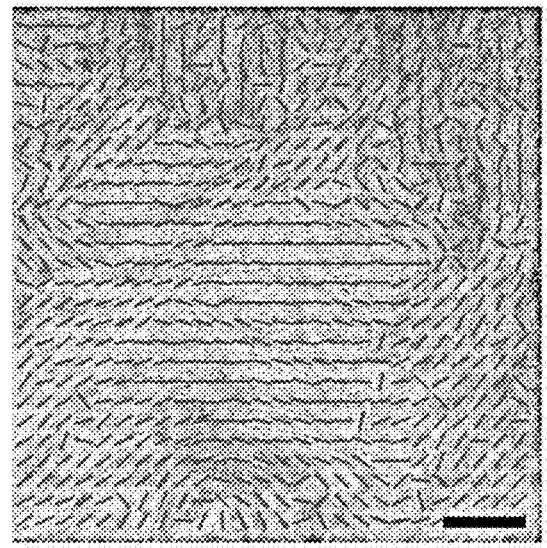
Figure 6F:
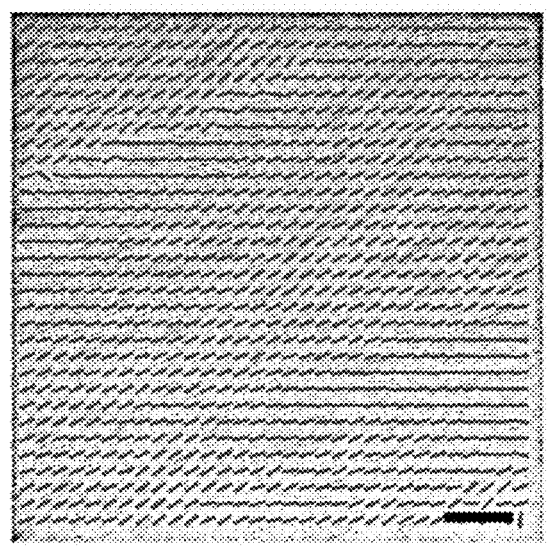
Figure 6F:
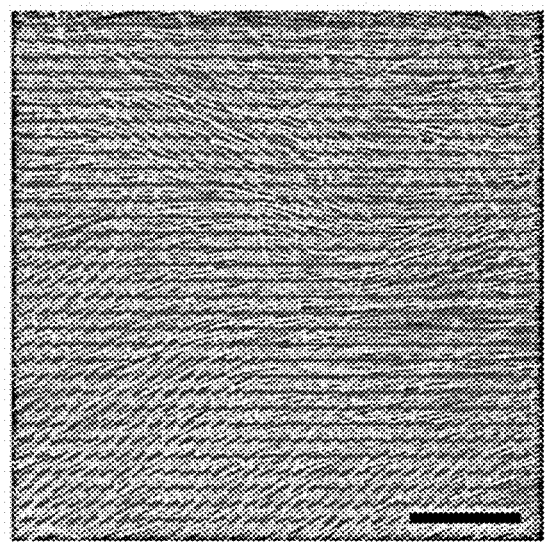
Figure 6F:
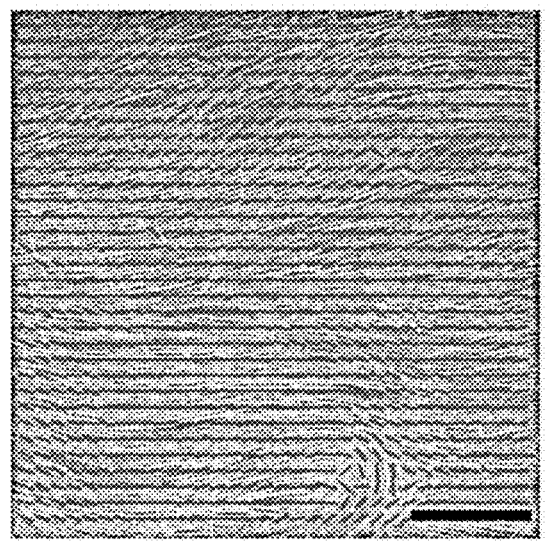
Figure 7A:
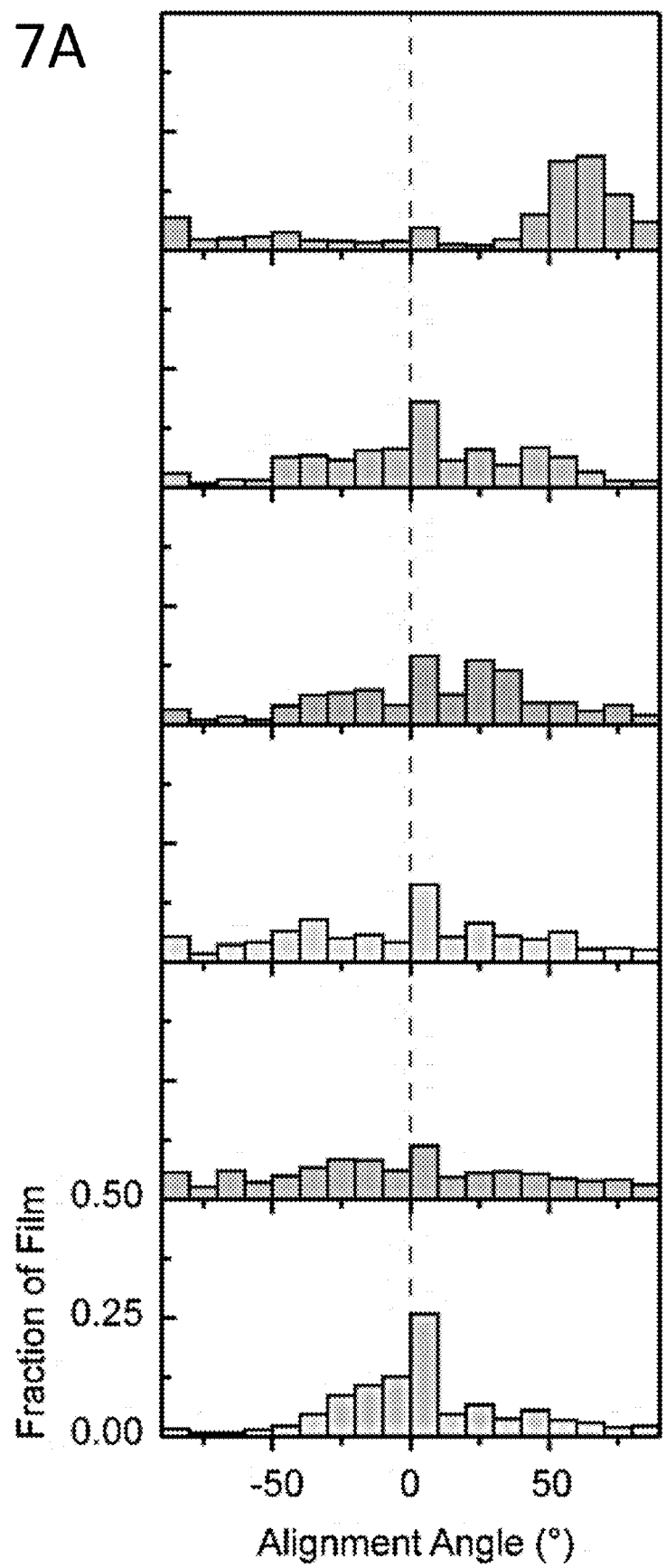
FIGS. 7A-7C show histograms of director orientations from FIGS. 6A-6F, where FIG. 7A, FIG. 7B, and FIG. 7C correspond to the volumetric flow rates of 0, 1, and, 4 mL $min^{-1}$ for the CNT dispersions.
Figure 7B:
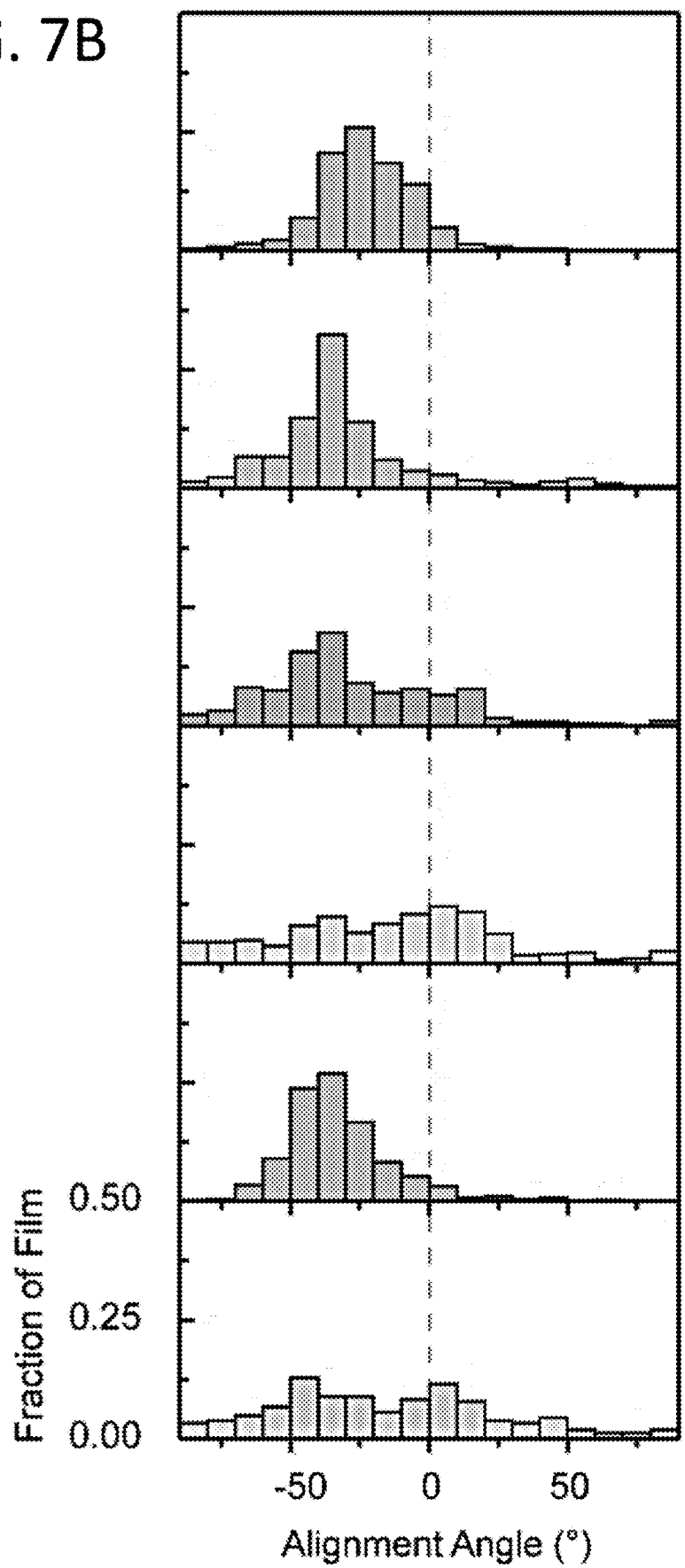
Figure 7C:
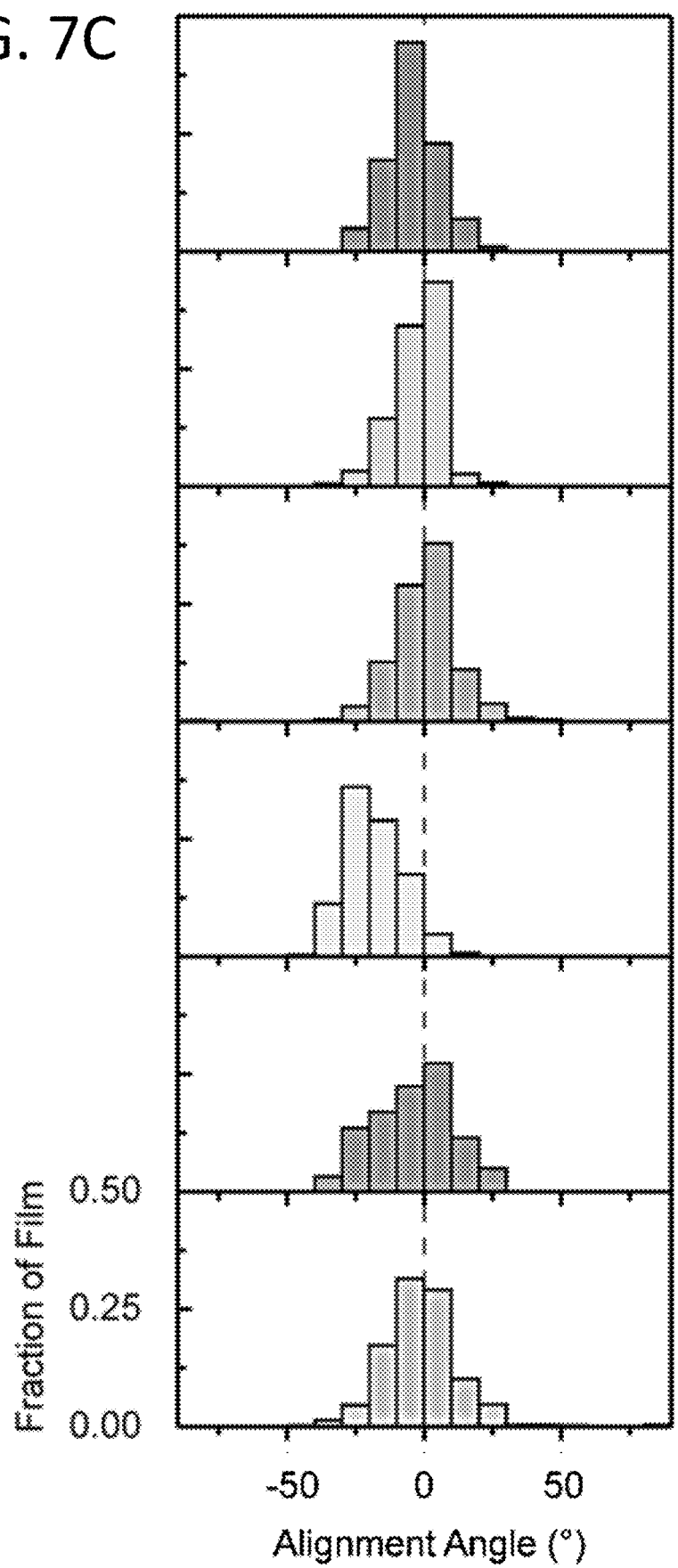

The FET-to-FET uniformity in on-current is quantified in FIG. 5C, for back gated FETs, at $V_{DS}$=−1 V. The 58 TaFISA FETs demonstrated a mean normalized standard deviation of only 19% (540±100 µA µm$^{-1}$).

The scalability of TaFISA was demonstrated by aligning nanotubes uniformly across the majority of a 10 cm wide wafer piece (FIGS. 2F-2H). The ink was injected in the channel at position (i). The flow developed between positions (i) and (ii) where few nanotubes were deposited. Between positions (ii) and (iii), the flow was developed, and aligned nanotubes were uniformly deposited onto the substrate as it was withdrawn from the water subphase. After position (iii), the flow was perturbed by end-effects encountered at the edge of the wafer, related to the curvature of the water meniscus and divergence of the flow as it exited the channel. Raman spectroscopy maps of nanotube density were measured across the 10 cm wide wafer and overlaid on a photograph of the wafer in FIG. 2F. The Raman maps demonstrate that the deposition was uniform across the region where the flow was fully developed (~60% of the wafer), confirming scalability. A histogram of the density analyzed between positions (ii) and (iii) is shown in FIG. 2G and shows density varied with a HWHM of only 19%. SEM images (FIG. 2H) obtained across the substrate also confirm the continuous deposition of highly aligned, densely packed nanotubes.

Materials and Methods

Preparation of Poly [(9,9-dioctylfluorenyl-2,7-diyl)-alt-co-(6,6'-{2,2'%-bipyridine})]-Wrapped Semiconducting Carbon Nanotubes. Semiconducting carbon nanotubes were isolated from arc-discharge nanotube soot (Sigma-Aldrich, #698695) using a mass ratio (1:1) of the raw soot to polyfluorene derivative polymer wrapper, poly[(9,9-dioctylfluorenyl-2,7-diyl)-alt-co-(6,6'-{2,2'-bipyridine})] (PFO-BPy) (American Dye Source, Inc., Quebec, Canada; #ADS153-UV). The PFO-BPy was first dispersed in toluene at a concentration of 2 mg mL$^{-1}$ and was then combined with the nanotube soot and sonicated at 40% amplitude for 10-30 min using a horn-tip ultrasonicator (Fisher Scientific, Waltham, Mass.; Sonic Dismembrator 500). This solution was centrifuged (Sorvall WX, TH-641, Thermo-Scientific) at 3×10$^5$ g for 10 min to remove undispersed nanotubes and other amorphous carbon allotropes. The top 90% of the supernatant of each centrifuge tube was collected and filtered. The filtered supernatants were concentrated to a total volume of 60 mL using a rotary evaporator. This concentrated solution was centrifuged for 12-24 h. The pellets were collected and then redispersed with fresh toluene. This centrifugation/redispersion process was repeated until the PFO-BPy:nanotube ratio was near 0.5:1 (4-10 repetitions). For the TaFISA alignment process, the pellets were then dispersed in chloroform (stabilized with ethanol from Fisher Scientific, #C606SK-1), and the concentration was measured optically. The nanotube concentration in solution was determined using known optical cross-sections from the $S_{22}$ transition. (Brady, G. J. et al. *Sci. Adv.* 2, (2016); and Mistry, K. et al., *ACS Nano* 7, 2231-2239 (2013).)

Preparation of Substrates. Highly p-type doped Si wafers with 90 nm or 15 nm of dry, thermal oxide were used. The substrates were cleaned with a piranha solution with a 2:1 volume ratio of $H_2SO_4$ (91-92.5%):$H_2O_2$ (30%) in a crystallizing dish on a 110° C. hot plate for 15 min (for 15 nm oxide) or 60 min (for 90 nm oxide), rinsed with deionized water, and dried with $N_2$. These piranha-cleaned wafers were baked for 335 s at 205° C. and exposed to hexamethyldisilizane (HMDS) vapor (Solitec VBS200 HMDS prime oven) for 2-10 s to achieve a water contact angle of 30-45°.

Fabrication of Carbon Nanotube FETs. After deposition of nanotubes on 15 nm $SiO_2$/Si substrates, 2 wt % polymethyl methacrylate (PMMA) was spin-cast at 3 k rpm for 90 s and then baked on a hot plate set at 185° C. for 90 s. Electron-beam lithography was used to define the active channel areas (channel width=4 μm), and the substrates were developed in 1:2 ratio of methyl isobutyl ketone to isopropyl alcohol (MIBK:IPA) by volume. Following a reactive ion etch (RIE) to remove the nanotubes surrounding the active channel areas, the films were boiled in toluene to remove excess PFO-BPy and vacuum annealed at 400° C. for 1 h to decompose and remove the alkyl side-chains of the PFO-BPy. Next, source and drain electrodes with channel length of 100 to 120 nm were fabricated within the isolated regions of nanotubes via electron-beam lithography, development, and thermal deposition of 17.5 nm of Pd and 17.5 nm of Au. Back dielectric and top ionic liquid gate architectures were used to electrostatically control the FETs. The back-gate architecture consisted of 15 nm $SiO_2$ and Si substrate serving as the gate dielectric and gate electrode, respectively. One advantage of this back-gate architecture is that it facilitated correlation between array morphology (via SEM) and electrical characteristics. While the relatively low capacitance of the 15 nm $SiO_2$ back-gate challenged optimization of transconductance and subthreshold swing, these parameters can be largely improved by using thinner top-gate dielectrics that increase the gate-channel capacitance as opposed to improving nanotube alignment and ordering. The top gate architecture utilized an ion gel prepared according to a previously published procedure. (Chen, C.-F. et al. *Nature* 471, 617-620 (2011).) Briefly, the ionic liquid, 1-ethyl-3-methylimidazolium bis(trifluoromethylsylphonyl) imide ([EMIM][TFSI]) is initially dried under vacuum at 100° C. for three days. The dried ionic liquid is fully mixed with polystyrene-b-poly(ethylene oxide)-b-polystyrene (PS-PEO-PS) in dichloromethane to create the ion gel. The ion gel is spuncoat on samples at 4000 rpm to uniformly coat the entire substrate. During measurement, the gate probe is simply inserted into the gel near the FET being measured. The backgated FETs exhibit hysteresis as expected for FETs measured on $SiO_2$ in air, which has been previously attributed to adsorbed water and oxygen and/or charge traps in the oxide, while the top-gated FETs exhibit much lower hysteresis.

Raman Spectroscopy. Raman spectroscopy (Thermo-Fisher Scientific, DXRxi, 532 nm excitation laser wavelength) was used to map carbon nanotube density. The intensity of the G-band Raman mode was directly related to the density of carbon nanotubes on the substrate (assuming a spatially uniform chirality distribution). (Lee, H. W. et al. *Small* 5, 1019-1024 (2009).) Prior to Raman measurement, the carbon nanotube films were soaked in toluene at 120° C. for 1 h and then vacuum annealed at 400° C. for 1 h. A Raman spectrum was collected at each pixel of the map, and the nanotube density was quantified by spectrally integrating over the G-band mode.

Experimental Setup. The TaFISA process was conducted using a channel, comprised of a target substrate and a barrier (here the substrate and barrier were the same material), that was attached to a substrate lift motor (Thorlabs MTS50-Z8) and suspended in a trough filled with deionized (resistivity ~18 MΩ) water. The ink was injected into the channel using a needle, and the ink volumetric flow rate was controlled using a syringe pump (Chemyx Nexus 3000). In this example, the channel was oriented 45° from the horizontal surface of the water—it was found that positioning the channel at this angle resulted in more uniform deposition across the length of the substrate. In this angled channel, the upper half of the channel was the target substrate on which aligned nanotube films were deposited, while the lower half was the barrier on which thicker films of primarily poorly aligned nanotubes were deposited. The needle was angled 15° from the horizontal, just slightly touching the surface of the water and roughly centered between the target substrate and barrier.

The word "illustrative" is used herein to mean serving as an example, instance, or illustration. Any aspect or design described herein as "illustrative" is not necessarily to be construed as preferred or advantageous over other aspects or designs. Further, for the purposes of this disclosure and unless otherwise specified, "a" or "an" can "only one" or can mean "one or more."

The foregoing description of illustrative embodiments of the invention has been presented for purposes of illustration and of description. It is not intended to be exhaustive or to limit the invention to the precise form disclosed, and modifications and variations are possible in light of the above teachings or may be acquired from practice of the invention. The embodiments were chosen and described in order to explain the principles of the invention and as practical applications of the invention to enable one skilled in the art to utilize the invention in various embodiments and with various modifications as suited to the particular use contemplated. It is intended that the scope of the invention be defined by the claims appended hereto and their equivalents.

What is claimed is:

1. A method of forming a film of aligned carbon nanotubes, the method comprising:
forming a liquid dispersion comprising organic material-coated carbon nanotubes dispersed in a first liquid;
forming a channel that is defined by:
a deposition wall;
a confining wall that is separated from the deposition substrate by a gap; and
a second liquid that is immiscible with the liquid dispersion spanning the gap between the deposition wall and the confining wall and providing a channel floor,
cooling the second liquid to a temperature of 15° C. or lower;
flowing the liquid dispersion of organic material-coated carbon nanotubes through the channel, over the cooled second liquid, to form an interface between the liquid dispersion of organic material-coated carbon nanotubes and the cooled second liquid, wherein the organic material-coated carbon nanotubes become concentrated at the interface and aligned within the interface along the flow direction; and
translating the deposition wall across the interface as the liquid dispersion of organic material-coated carbon nanotubes flows through the channel, whereby organic material-coated carbon nanotubes are deposited from the interface onto a surface of the deposition wall.

2. The method of claim 1, wherein the temperature below ambient temperature is in the range from 15° C. to 1° C.

3. The method of claim 1, wherein the temperature below ambient temperature is in the range from 12° C. to 5° C.

4. The method of claim 1, wherein the concentration of carbon nanotubes in the liquid dispersion is in the range from 5 µg/mL to 200 µg/mL.

5. The method of claim 1, wherein the concentration of carbon nanotubes in the liquid dispersion is in the range from 50 µg/mL to 150 µg/mL.

6. The method of claim 1, wherein the liquid dispersion of organic material-coated carbon nanotubes has a flow rate in the range from 2 mL/min to 12 mL/min.

7. The method of claim 1, wherein the surface of the deposition wall and the floor of the channel define a tilt angle in the range from 5° to 85°.

8. The method of claim 7, wherein the surface of the deposition wall comprises silicon oxide.

9. The method of claim 8, wherein the organic material is a poly(9,9-dialkyl-fluorene) derivative or a poly(phenyl vinylene) derivative.

10. The method of claim 1, wherein the liquid dispersion is a non-aqueous liquid dispersion and the second liquid is an aqueous liquid.

11. A method of forming a film of aligned carbon nanotubes, the method comprising:
forming a liquid dispersion comprising organic material-coated carbon nanotubes dispersed in a first liquid;
forming a channel that is defined by:
a deposition wall;
a confining wall that is separated from the deposition substrate by a gap; and
a second liquid that is immiscible with the liquid dispersion spanning the gap between the deposition wall and the confining wall and providing a channel floor, wherein the deposition wall and the floor of the channel define a tilt angle in the range from 5° to 85°,
flowing the liquid dispersion of organic material-coated carbon nanotubes through the channel, over the second liquid, to form an interface between the liquid dispersion of organic material-coated carbon nanotubes and the second liquid, wherein the organic material-coated carbon nanotubes become concentrated at the interface and aligned within the interface along the flow direction; and
translating the deposition wall across the interface as the liquid dispersion of organic-material coated carbon nanotubes flows through the channel, whereby organic material-coated carbon nanotubes are deposited from the interface onto the deposition wall.

12. The method of claim 11, wherein the deposition wall and the floor of the channel define a tilt angle in the range from 15° to 60°.

13. The method of claim 11, wherein the concentration of carbon nanotubes in the liquid dispersion is in the range from 5 µg/mL to 200 µg/mL.

14. The method of claim 11, wherein the concentration of carbon nanotubes in the liquid dispersion is in the range from 50 µg/mL to 150 µg/mL.

15. The method of claim 11, wherein the liquid dispersion of organic material-coated carbon nanotubes has a flow rate in the range from 2 mL/min to 12 mL/min.

16. The method of claim 11, wherein the surface of the deposition wall comprises silicon oxide.

17. The method of claim 11, wherein the organic material is a poly(9,9-dialkyl-fluorene) derivative or a poly(phenyl vinylene) derivative.

18. The method of claim 11, wherein the liquid dispersion is a non-aqueous liquid dispersion and the second liquid is an aqueous liquid.

* * * * *

UNITED STATES PATENT AND TRADEMARK OFFICE
CERTIFICATE OF CORRECTION

PATENT NO. : 11,631,814 B2
APPLICATION NO. : 17/376295
DATED : April 18, 2023
INVENTOR(S) : Michael Scott Arnold et al.

It is certified that error appears in the above-identified patent and that said Letters Patent is hereby corrected as shown below:

On the Title Page

In Item (56), under "FOREIGN PATENT DOCUMENTS", in Column 2, Line 1, delete "WO 2007/01571" and insert -- WO 2007/015710 --, therefor.

In the Specification

In Column 14, Line 47, delete "h–1=77" and insert -- $h^{-1} = 77$ --, therefor.

In Column 15, Line 14, delete "co-(6,6'-{2,2'%-" and insert -- *co*-(6,6'-{2,2'- --, therefor.

Signed and Sealed this
Twenty-ninth Day of August, 2023

*Katherine Kelly Vidal*

Katherine Kelly Vidal
*Director of the United States Patent and Trademark Office*